(12) United States Patent
    Seong et al.

(10) Patent No.: US 12,660,101 B2
(45) Date of Patent: Jun. 16, 2026

(54) DISPLAY DEVICE

(71) Applicant: Samsung Display Co., LTD., Yongin-si (KR)

(72) Inventors: Ju Yeop Seong, Yongin-si (KR); Jong Hyuck Kim, Yongin-si (KR); Man Sik Myung, Yongin-si (KR); Sung June Park, Yongin-si (KR); Hee Kwon Lee, Yongin-si (KR); Jae Soo Jang, Yongin-si (KR); Jae Won Jeong, Yongin-si (KR); Sung Chul Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 193 days.

(21) Appl. No.: 18/444,666

(22) Filed: Feb. 17, 2024

(65) Prior Publication Data

US 2025/0031320 A1     Jan. 23, 2025

(30) Foreign Application Priority Data

Jul. 20, 2023     (KR) ......................... 10-2023-0094289

(51) Int. Cl.
    B32B 3/10          (2006.01)
    H05K 5/02          (2006.01)
(52) U.S. Cl.
    CPC ..................................... H05K 5/02 (2013.01)
(58) Field of Classification Search
    None
    See application file for complete search history.

(56) References Cited

U.S. PATENT DOCUMENTS

| | | | |
|---|---|---|---|
| 11,161,323 B2 | 11/2021 | Choi et al. | |
| 11,787,154 B2 | 10/2023 | Jeong et al. | |
| 11,950,379 B2 | 4/2024 | Kim et al. | |
| 2021/0191459 A1* | 6/2021 | Kim | ...................... H10K 59/87 |
| 2022/0115471 A1* | 4/2022 | Lee | ......................... G09F 9/301 |

FOREIGN PATENT DOCUMENTS

| | | |
|---|---|---|
| CN | 115731780 A | 3/2023 |
| JP | 2023512575 A | 3/2023 |
| KR | 1020150051913 A | 5/2015 |
| KR | 1020200049942 A | 5/2020 |
| KR | 1020210104515 A | 8/2021 |
| KR | 1020220001035 | 1/2022 |
| KR | 1020220048517 | 4/2022 |
| KR | 1020220077953 | 6/2022 |
| KR | 102528474 | 5/2023 |

* cited by examiner

*Primary Examiner* — Christopher M Polley
(74) *Attorney, Agent, or Firm* — CANTOR COLBURN LLP

(57)          ABSTRACT

A display device includes: a display panel including first and second surfaces, which are opposite to each other, an elastic member disposed on the first surface, a first rigid member disposed on the elastic member, and a panel support member disposed on the second surface, wherein the first rigid member includes at least one of polyethylene terephthalate (PET), polyimide, and ultra-thin glass (UTG), and the elastic member includes at least one of a dilatant, polyether block amide (PEBA), and thermoplastic polyurethane (TPU).

23 Claims, 24 Drawing Sheets

ADH8: ADH8-1, ADH8-2
900: 910, 920
1000: 1010, 1020
1100: 1110, 1120

ADH8: ADH8-1, ADH8-2
900: 910, 920
1000: 1010, 1020
1100: 1110, 1120

ADH8: ADH8-1, ADH8-2
900: 910, 920
1000: 1010, 1020
1100: 1110, 1120

ADH8: ADH8-1, ADH8-2
900: 910, 920
1000: 1010, 1020
1100: 1110, 1120

ADH8: ADH8-1, ADH8-2
900: 910, 920
1000: 1010, 1020
1100: 1110, 1120

ADH8: ADH8-1, ADH8-2
900: 910, 920
1000: 1010, 1020
1100: 1110, 1120

DISPLAY DEVICE

This application claims priority to Korean Patent Application No. 10-2023-0094289, filed on Jul. 20, 2023, and all the benefits accruing therefrom under 35 U.S.C. § 119, the content of which in its entirety is herein incorporated by reference.

BACKGROUND

1. Field

The present disclosure relates to a display device.

2. Description of the Related Art

With the advancement of the information society, the demand for display devices, used for displaying images, has become more diverse. For instance, display devices are now applied to various electronic devices such as smartphones, digital cameras, laptops, navigation systems, and smart televisions.

To enhance the portability of display devices while providing a larger display screen, flexible displays such as bendable, foldable, slidable, and rollable displays have been introduced.

It is desirable for these flexible displays to have not only flexibility for easy shape deformations but also strong impact resistance, especially for products with the display surface facing outward. Such products are more susceptible to external impacts with both flexibility and robust impact resistance.

SUMMARY

Aspects of the present disclosure provide a display device having high impact resistance against various forms of external impacts.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including: a display panel including first and second surfaces, which are opposite to each other, an elastic member disposed on the first surface, a first rigid member disposed on the elastic member, and a panel support member disposed on the second surface, where the first rigid member includes at least one of polyethylene terephthalate ("PET"), polyimide, and ultra-thin glass ("UTG"), and the elastic member includes at least one of a dilatant, polyether block amide ("PEBA"), and thermoplastic polyurethane ("TPU").

In an embodiment, the display device may further include: a second rigid member disposed between the elastic member and the display panel, where the second rigid member may include at least one of PET and polyimide.

In an embodiment, the display device may further include: a third rigid member disposed between the second rigid member and the display panel, where the third rigid member may include UTG.

In an embodiment, the third rigid member may have a greater modulus value than each of the first and second rigid members.

In an embodiment, the third rigid member may have a greater thickness than the first rigid member, and the first rigid member may have a greater thickness than the second rigid member.

In an embodiment, the third rigid member and the display panel may be coupled to each other by an adhesive member therebetween.

In an embodiment, the display device may further include: a fourth rigid member disposed between the display panel and the panel support member, where the fourth rigid member may include at least one of PET and polyimide.

In an embodiment, the display device may further include: at least one of first and second adhesive members, the first adhesive member being disposed between the display panel and the elastic member and the second adhesive member being disposed between the elastic member and the first rigid member, where the at least one of the first and second adhesive members may include the dilatant.

According to an aspect of the present disclosure, there is provided a display device including: a display panel including first and second surfaces, which are opposite to each other, an elastic member disposed on the first surface, a first rigid member disposed on the elastic member, a panel support member disposed on the second surface, a second rigid member disposed between the elastic member and the display panel, at least one upper adhesive member disposed between two of the display panel, the elastic member, the first rigid member, and the second rigid member, and at least one lower adhesive member disposed between the display panel and the panel support member, where the at least one upper adhesive member has a greater thickness than the at least one lower adhesive member.

In an embodiment, the thickness of the at least one upper adhesive member may be two to five times the thickness of the at least one lower adhesive member.

In an embodiment, the at least one upper adhesive member may include: a first adhesive member, which is disposed between the display panel and the second rigid member, and a second adhesive member, which is disposed between the second rigid member and the elastic member, and the second adhesive member may have a smaller width than the first adhesive member.

In an embodiment, the second adhesive member may have a weaker adhesive force than the first adhesive member.

In an embodiment, the display device may further include: a third rigid member disposed between the second rigid member and the display panel, where the at least one upper adhesive member may include: a first adhesive member, which is disposed between the display panel and the third rigid member, and a second adhesive member, which is disposed between the second rigid member and third rigid member, and the second adhesive member may have a smaller width than the first adhesive member.

In an embodiment, the third rigid member may include ultra-thin glass (UTG).

In an embodiment, the display device may further include: a fourth rigid member disposed between the display panel and the panel support member, where the fourth rigid member may include at least one of polyethylene terephthalate (PET) and polyimide.

According to an aspect of the present disclosure, there is provided a display device including: a display panel including first and second surfaces, which are opposite to each other, an elastic member disposed on the first surface, a first rigid member disposed on the elastic member, and a panel support member disposed on the second surface, where the first rigid member has a greater modulus value than the elastic member.

In an embodiment, the elastic member may have a modulus value of less than 1 gigapascal (GPa) at room temperature.

In an embodiment, the first rigid member may have a modulus value of 10 GPa to 15 GPa at room temperature.

In an embodiment, the first rigid member may include at least one of polyethylene terephthalate (PET), polyimide, and ultra-thin glass (UTG).

In an embodiment, the elastic member may include a dilatant.

In an embodiment, the elastic member may include at least one of polyether block amide (PEBA) and thermoplastic polyurethane (TPU).

In an embodiment, the display device may further include: a second rigid member disposed between the elastic member and the display panel, where the second rigid member may include at least one of PET and polyimide.

In an embodiment, the display device may further include: a third rigid member disposed between the elastic member and the display panel, where the third rigid member may include UTG.

In an embodiment, the display device may further include: a fourth rigid member disposed between the display panel and the panel support member, where the fourth rigid member may include at least one of PET and polyimide.

In an embodiment, the first surface may be a display surface for displaying images.

According to the aforementioned and other embodiments of the present disclosure, display device having high impact resistance against various forms of external impacts can be provided.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
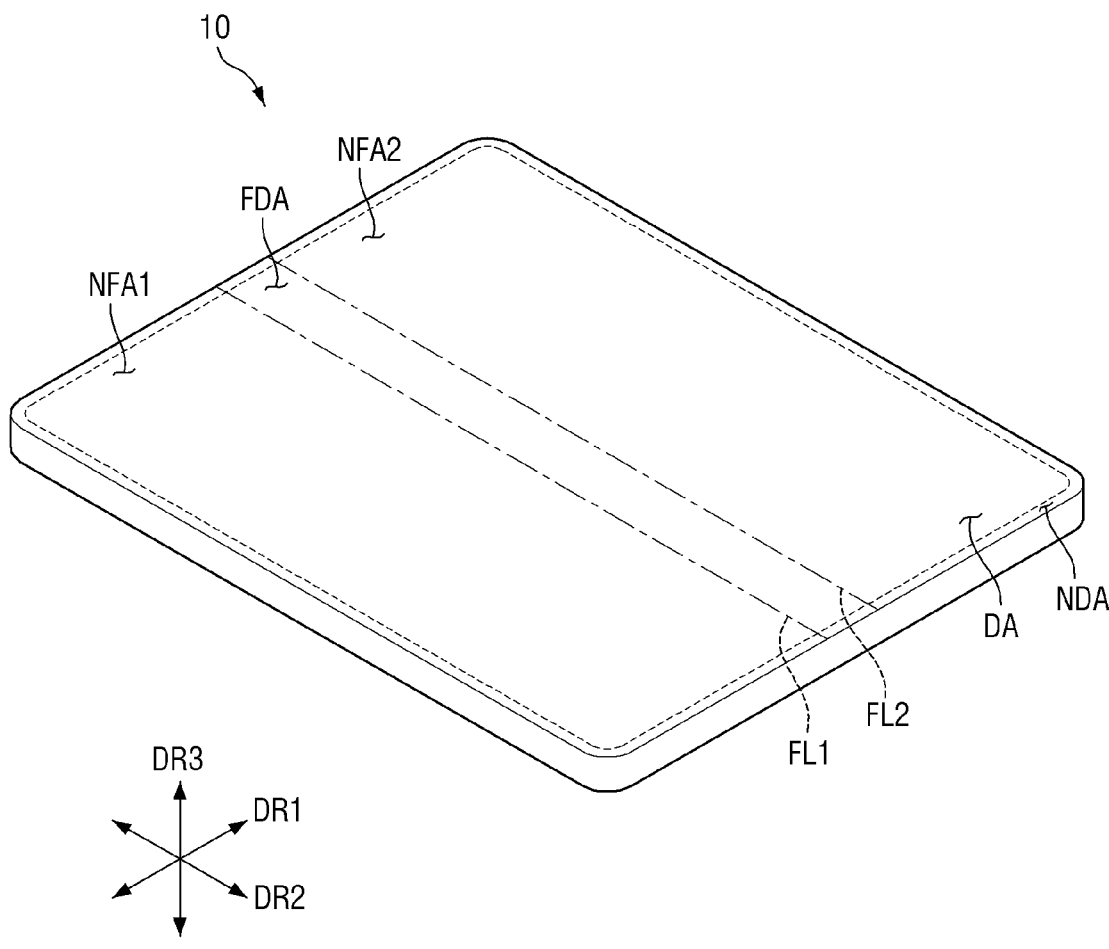
FIG. 1 is a perspective view of a display device in its unfolded state.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. The same reference numbers indicate the same components throughout the specification.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below. Hereinafter, embodiments of the present disclosure will be described in detail with reference to the accompanying drawings.

Figure 2:
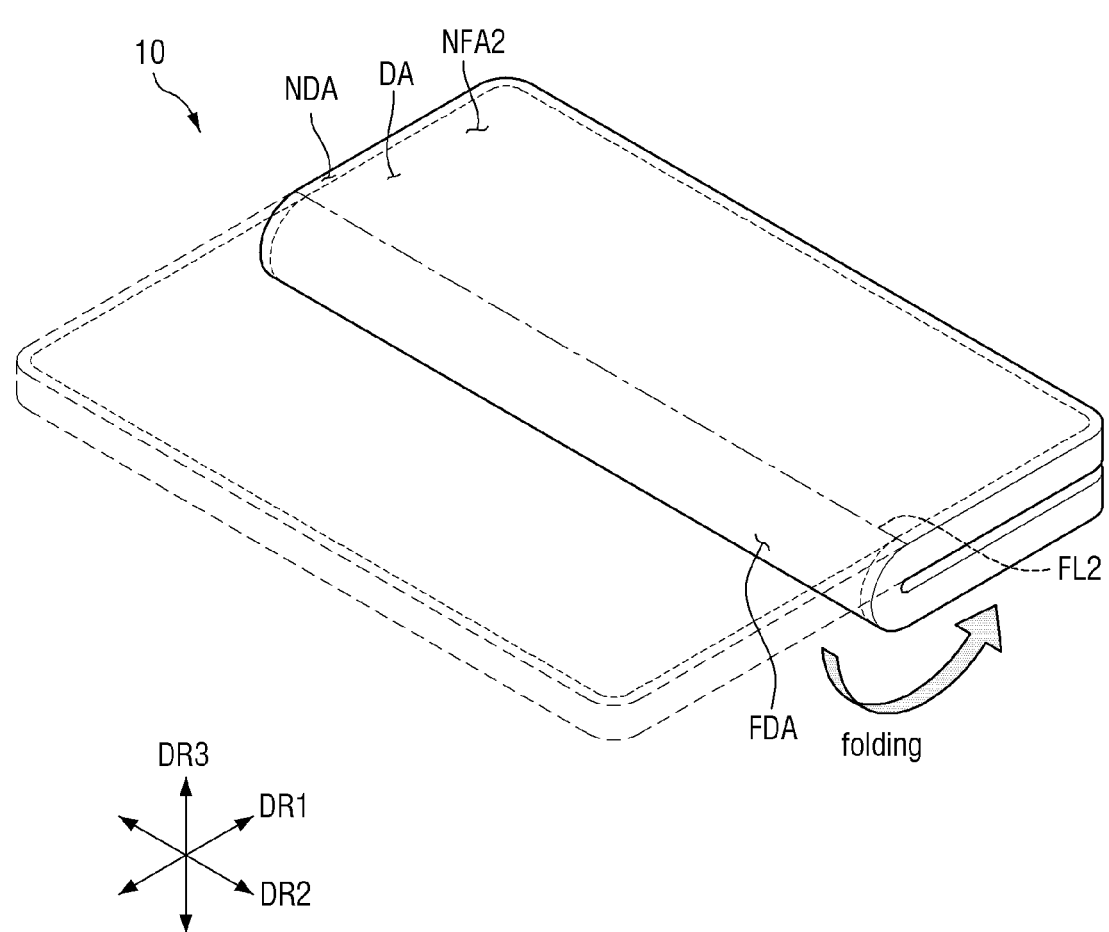
FIG. 2 is a perspective view of the display device of FIG. 1 in its folded state.

FIG. 1 is a perspective view of a display device in its unfolded state. FIG. 2 is a perspective view of the display device of FIG. 1 in its folded state.

Specifically, FIG. 1 illustrates a first state where a display device 10 is unfolded without being folded along first and second folding lines FL1 and FL2, and FIG. 2 illustrates a second state where the display device 10 is folded along the first and second folding lines FL1 and FL2.

Referring to FIGS. 1 and 2, the display device 10, which is a device used to display videos or still images, may be applicable to various portable electronic devices, such as mobile phones, smartphones, tablet personal computers, smartwatches, watch phones, mobile communication terminals, electronic notepads, e-book readers, portable multimedia players ("PMPs"), navigation systems, and Ultra Mobile PCs ("UMPCs"), as well as diverse products such as televisions, laptops, monitors, advertising displays, and Internet of Things ("IoT") devices.

In some embodiments, the display device 10 may be a flexible display, such as a bendable, foldable, slidable, or rollable display. In such cases, at least some parts of the display device 10 may undergo shape changes, such as bending, folding, sliding, or rolling. For convenience, the display device 10 will hereinafter be described as being, for example, a foldable display, but the present disclosure is not limited thereto.

In FIGS. 1 and 2, a first direction DR1 refers to the direction parallel to one side of the display device 10 when viewed in plan, for example, the horizontal direction of the display device 10, a second direction DR2 refers to the direction parallel to a side of the display device 10 that meets the one side of the display device 10 when viewed in plan, for example, the vertical direction of the display device 10, and a third direction DR3 refers to the direction of the thickness of the display device 10.

The display device 10 may have a rectangular or square shape in a plan view. The corners of the display device 10 may be right-angled or rounded. The display device 10 may have two short sides aligned in the first direction DR1 and two long sides aligned in the second direction DR2.

The display device 10 may include a display area DA and a non-display area NDA. The plane shape of the display area DA may conform to the shape of the display device 10. For example, if the display device 10 has a rectangular plane shape, the display area DA may also have a rectangular plane shape.

The display area DA may be an area including a plurality of pixels and thereby displaying an image. On the other hand, the non-display area NDA may be an area not including pixels and not displaying any image. The non-display area NDA may be arranged around the display area DA. The non-display area NDA may surround the display area DA, but the present disclosure is not limited thereto. The display area DA may be partially surrounded by the non-display area NDA in another embodiment.

The display device 10 may be able to maintain both the first state where it is unfolded and the second state where it is folded. The display device 10 may be out-folded, as illustrated in FIG. 2, so that the display area DA may face outward. In this case, the rear sides of the display device 10 may face each other when folded. Alternatively, in other embodiments, the display device 10 may be in-folded so that the display area DA may face inward. In this case, the front sides of the display device 10 may face each other when folded.

The display device 10 may include a folding area FDA, a first non-folding area NFA1, and a second non-folding area NFA2. The folding area FDA may be a region where the display device 10 is bent or folded, while the first and second non-folding areas NFA1 and NFA2 are regions where the display device 10 remains unbent or unfolded. In some embodiments, the first and second non-folding areas NFA1 and NFA2 may be flat regions of the display device 10.

The first non-folding area NFA1 may be positioned on one side (e.g., the left side) of the folding area FDA. The second non-folding area NFA2 may be positioned on the other side (e.g., the right side) of the folding area FDA. The folding area FDA may be defined by the first and second folding lines FL1 and FL2, representing the regions where the display device 10 is curved with a predetermined curvature. The first folding line FL1 may correspond to the boundary between the folding area FDA and the first non-folding area NFA1, while the second folding line FL2 may correspond to the boundary between the folding area FDA and the second non-folding area NFA2.

The first and second folding lines FL1 and FL2 extend in the second direction DR2, as illustrated in FIGS. 1 and 2, in which case the display device 10 can be folded in half along the second direction DR2. When the display device 10 is folded in half along the second direction DR2, the length of the display device 10 in the first direction DR1 is reduced to approximately half, making it more convenient for a user to carry the display device 10.

When the first and second folding lines FL1 and FL2 extend in the second direction DR2, as illustrated in FIGS. 1 and 2, the length of the folding area FDA in the second direction DR2 may be greater than the length of the folding area FDA in the first direction DR1. Similarly, the length of the first non-folding area NFA1 in the second direction DR2 may be greater than the length of the first non-folding area NFA1 in the first direction DR1, and the length of the second non-folding area NFA2 in the second direction DR2 may be greater than the length of the second non-folding area NFA2 in the first direction DR1.

The display area DA and the non-display area NDA may overlap with at least one of the folding area FDA, the first non-folding area NFA1, and the second non-folding area NFA2. FIGS. 1 and 2 illustrate an example where the display area DA overlaps with the folding area FDA, and the non-display area NDA overlaps with the first and second non-folding areas NFA1 and NFA2.

Figure 3:
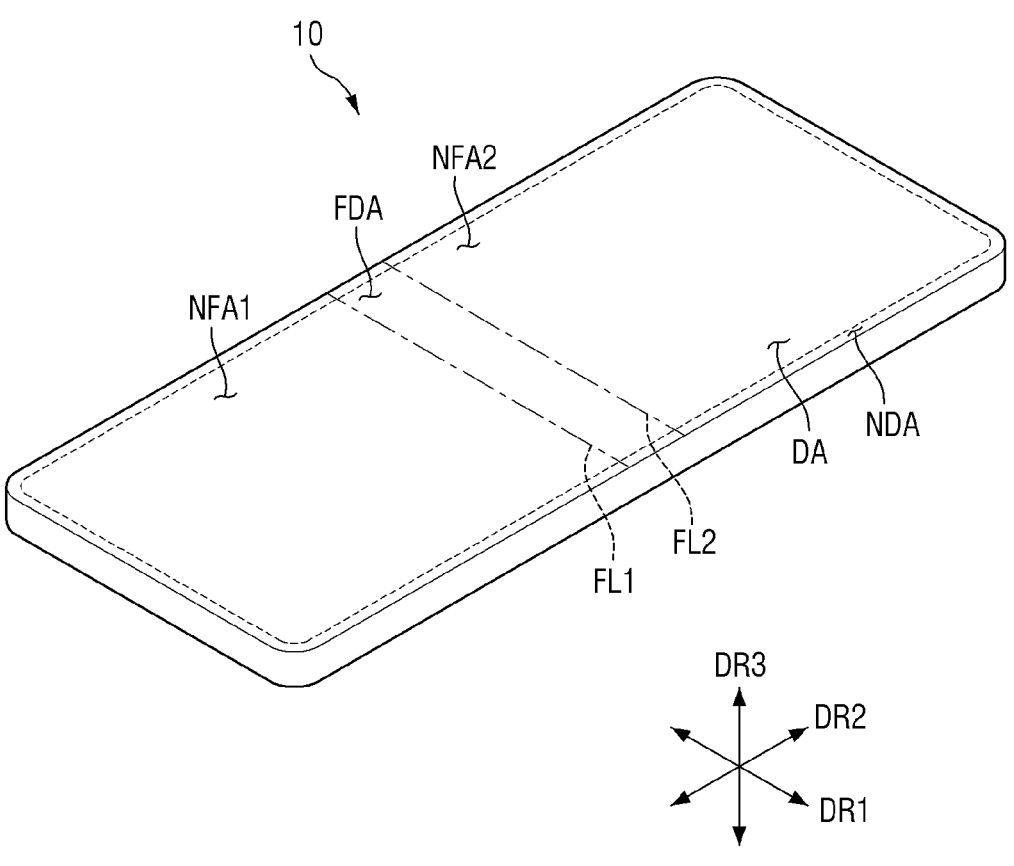
FIG. 3 is a perspective view of another display device in its unfolded state.
Figure 4:
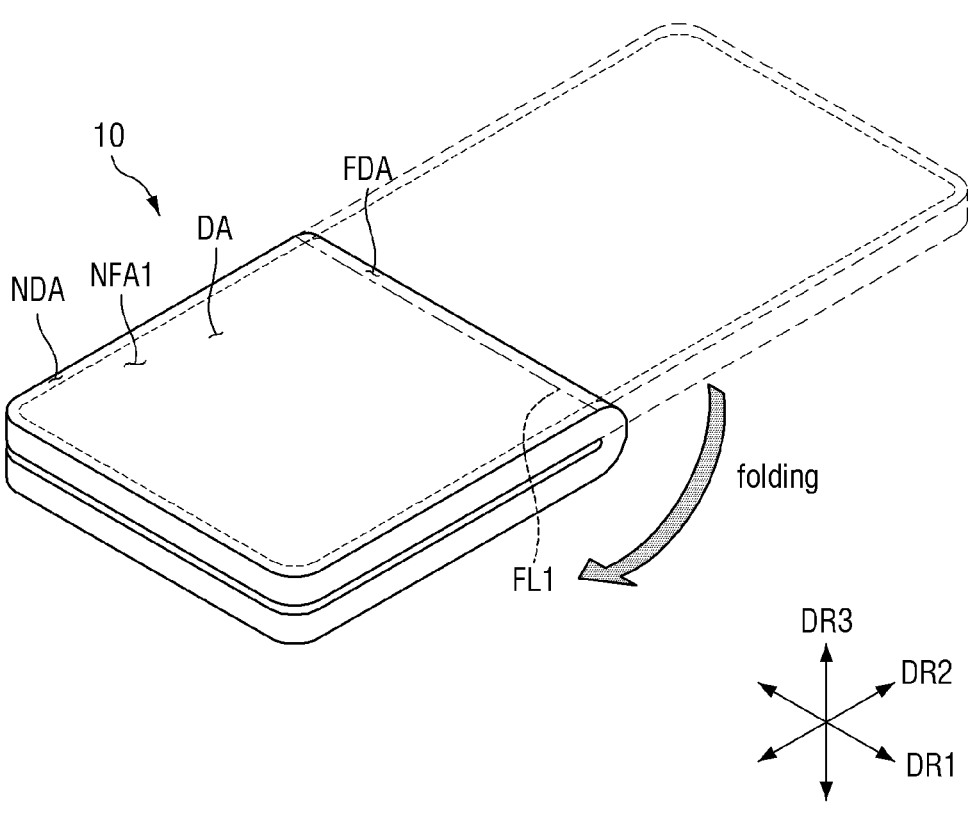
FIG. 4 is a perspective view of the display device of FIG. 3 in its folded state.

FIG. 3 is a perspective view of another display device in its unfolded state according to another embodiment of the present disclosure. FIG. 4 is a perspective view of the display device of FIG. 3 in its folded state.

The embodiment of FIGS. 3 and 4 differs from the embodiment of FIGS. 1 and 2 in that first and second folding lines FL1 and FL2 extend in the first direction DR1 and a display device 10 is folded in half along the second direction DR2 so that the length of the display device 10 in the second direction DR2 can be reduced to approximately half. In the following description of FIGS. 3 and 4, redundant descriptions from FIGS. 1 and 2 will be omitted.

Specifically, FIG. 3 illustrates a first state where the display device 10 is unfolded without being folded along first and second folding lines FL1 and FL2, and FIG. 4 illustrates a second state where the display device 10 is folded along the first and second folding lines FL1 and FL2.

In the unfolded first state of the display device 10, the long sides of the display device 10 may extend along the second direction DR2, and the short sides of the display device may extend along the first direction DR1.

A first non-folding area NFA1 may be positioned on one side (e.g., the bottom side) of a folding area FDA. A second non-folding area NFA2 may be positioned on the other side (e.g., the top side) of the folding area FDA.

The first and second folding lines FL1 and FL2 may extend in the first direction DR1, as illustrated in FIGS. 3 and 4, in which case the display device 10 may be folded in half along the first direction DR1. When the display device 10 is folded in half along the first direction DR1, the length of the display device 10 in the second direction DR2 is reduced to approximately half, making it more convenient for a user to carry the display device 10.

When the first and second folding lines FL1 and FL2 extend in the first direction DR1, as shown in FIGS. 3 and 4, the length of the folding area FDA in the first direction DR1 may be greater than the length of the folding area FDA in the second direction DR2. Similarly, the length of the first non-folding area NFA1 in the second direction DR2 may be greater than the length of the first non-folding area NFA1 in the first direction DR1, and the length of the second non-folding area NFA2 in the second direction DR2 may be greater than the length of the second non-folding area NFA2 in the first direction DR1.

Figure 5:
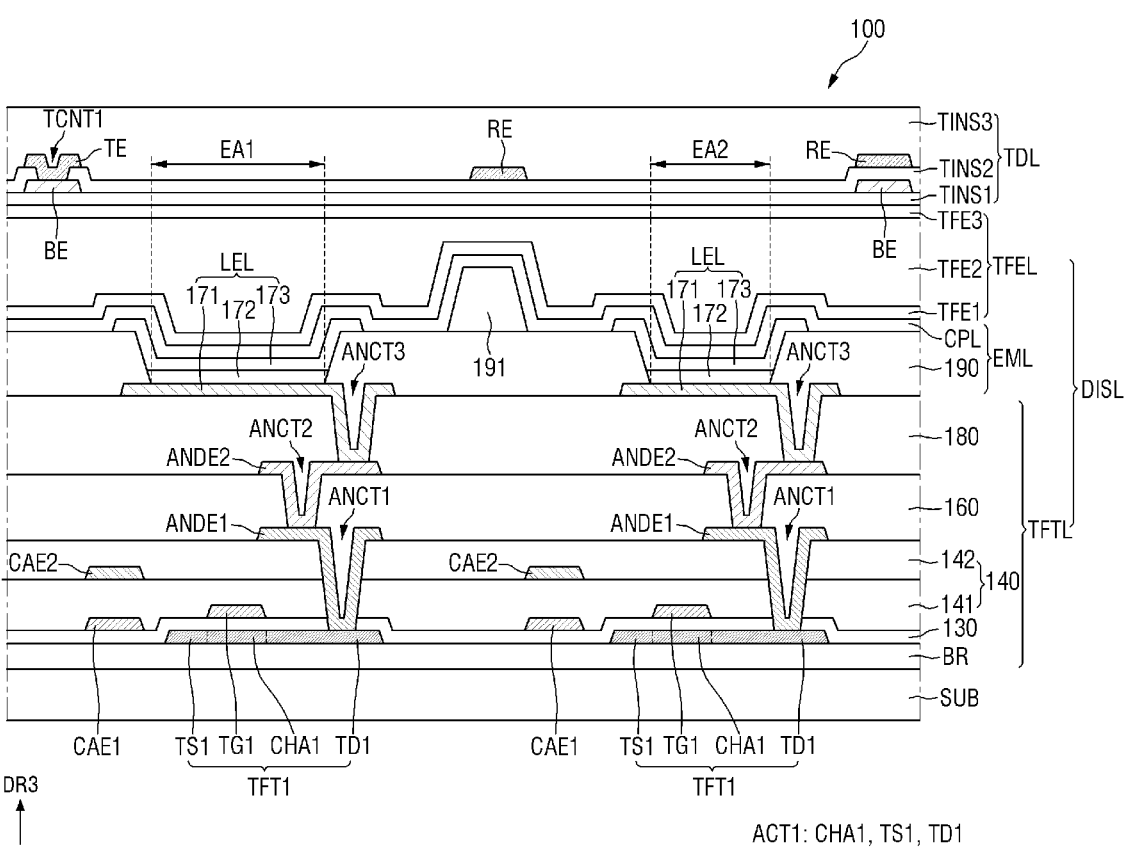
FIG. 5 is a cross-sectional view of a display panel according to an embodiment of the present disclosure.

FIG. 5 is a cross-sectional view of a display panel according to an embodiment of the present disclosure.

Referring to FIG. 5, a display panel 100 may include a substrate SUB, a display layer DISL, which is disposed on the substrate SUB, and a touch sensing layer TDL, which is disposed on the display layer DISL. The display layer DISL may include a thin-film transistor ("TFT") layer TFTL, a light-emitting element EML, and an encapsulation layer TFEL.

The TFT layer TFTL may be disposed on the substrate SUB. The TFT layer TFTL may include a barrier film BR, TFTs TFT1, first capacitor electrodes CAE1, second capacitor electrodes CAE2, first anode connection electrodes ANDE1, second anode connection electrodes ANDE2, a gate insulating film 130, a first interlayer-insulating film 141, a second interlayer-insulating film 142, a first planarization film 160, and a second planarization film 180.

The substrate SUB may be formed of or include an insulating material such as a polymer resin. In an embodiment, for example, the substrate SUB may be formed of or include polyimide. The substrate SUB may be a flexible substrate that is bendable, foldable, or rollable.

The barrier film BR may be disposed on the substrate SUB. The barrier film BR is a film that protects the TFTs TFT1 of the TFT layer TFTL and light-emitting layers 172 of the light-emitting layer EML from moisture penetrating through the substrate SUB, which is sensitive to moisture. The barrier layer BR may include multiple inorganic films stacked alternately. In an embodiment, for example, the barrier layer BR may be a multilayer structure by alternately stacking one or more inorganic films, such as a silicon nitride layer, a silicon oxynitride layer, a silicon oxide layer, a titanium oxide layer, and/or an aluminum oxide layer.

The TFTs TFT1 may be disposed on the barrier film BR. Active layers ACT1 of the TFTs TFT1 may be located on the barrier layer BR. The active layers ACT1 of the TFTs TFT1 may include polycrystalline silicon, monocrystalline silicon, low-temperature polycrystalline silicon, amorphous silicon, or an oxide semiconductor.

The active layers ACT1 may include channel regions CHA1, source regions TS1, and drain regions TD1. The channel regions CHA1 may be regions that overlap with gate electrodes TG1 in the third direction DR3, which is the thickness direction of the substrate SUB. The source regions TS1 may be positioned one side of the channel regions CHA1, and the drain regions TD1 may be positioned on the other side of the channel regions CHA1. The source regions TS1 and the drain regions TD1 may be regions that do not overlap with the gate electrodes TG1 in the third direction DR3. The source regions TS1 and the drain regions TD1 may be doped with ions or impurities in silicon or oxide semiconductors to form conductive regions.

The gate insulating film 130 may be disposed on the active layers ACT1 of the TFTs TFT1. The gate insulating film 130 may be formed as an inorganic film, such as a silicon nitride layer, a silicon oxynitride layer, a silicon oxide layer, a titanium oxide layer, or an aluminum oxide layer.

The gate electrodes TG1 and the first capacitor electrodes CAE1 may be disposed on the gate insulating film 130. The gate electrodes TG1 may overlap with the channel regions CHA1 in the third direction DR3. FIG. 5 illustrates that the gate electrodes TG1 are spaced apart from the first capacitor electrodes CAE1, but alternatively, the gate electrodes TG1 and the first capacitor electrodes CAE1 may be connected and may be integrally formed. The gate electrodes TG1 and the first capacitor electrodes CAE1 may be formed as single layers or multilayers composed of any one or a combination of molybdenum (Mo), aluminum (Al), chromium (Cr), gold (Au), titanium (Ti), nickel (Ni), neodymium (Nd), and copper (Cu).

The first interlayer-insulating film 141 may be disposed on the gate electrodes TG1 and the first capacitor electrodes CAE1. The first interlayer-insulating film 141 may be formed as an inorganic film, for example, a silicon nitride layer, a silicon oxynitride layer, a silicon oxide layer, a titanium oxide layer, or an aluminum oxide layer. The first interlayer-insulating film 141 may be formed as a stack of multiple inorganic films.

The second capacitor electrodes CAE2 may be disposed on the first interlayer-insulating film 141. The second capacitor electrodes CAE2 may overlap with the first capacitor electrodes CAE1 in the third direction DR3. In a case where the gate electrodes TG1 and the first capacitor electrodes CAE1 are integrally formed, the second capacitor electrodes CAE2 may overlap with the gate electrodes TG1 in the third direction DR3. Since the first interlayer-insulating film 141 has a predetermined dielectric constant, capacitors may be formed by the first capacitor electrodes CAE1, the second capacitor electrodes CAE2, and the first interlayer-insulating film 141 between the first capacitor electrodes CAE1 and the second capacitor electrodes CAE2. The second capacitor electrodes CAE2 may be formed as single layers or multilayers composed of any one or a combination of Mo, Al, Cr, Au, Ti, Ni, Nd, and Cu.

The second interlayer-insulating film 142 may be disposed on the second capacitor electrodes CAE2. The second interlayer-insulating film 142 may be formed as an inorganic film, for example, a silicon nitride layer, a silicon oxynitride layer, a silicon oxide layer, a titanium oxide layer, or an aluminum oxide layer. The second interlayer-insulating film 142 may be formed as a stack of multiple inorganic films.

The first anode connection electrodes ANDE1 may be disposed on the second interlayer-insulating film 142. The first anode connection electrodes ANDE1 may be connected to the drain regions TD1 of the TFTs TFT1 through first connection contact holes ANCT1, which penetrate the gate insulating film 130, the first interlayer-insulating film 141, and the second interlayer-insulating film 142. The first anode connection electrodes ANDE1 may be formed as single layers or multilayers composed of any one or a combination of Mo, Al, Cr, Au, Ti, Ni, Nd, and Cu.

The first planarization film 160, which is for planarizing steps formed by the TFTs TFT1, may be disposed on the first anode connection electrodes ANDE1. The first planarization film 160 may be formed as an organic film composed of an acrylic resin, an epoxy resin, a phenolic resin, a polyamide resin, or a polyimide resin.

The second anode connection electrodes ANDE2 may be disposed on the first planarization film 160. The second anode connection electrodes ANDE2 may be connected to the first anode connection electrodes ANDE1 through second connection contact holes ANCT2, which penetrate the first planarization film 160. The second anode connection electrodes ANDE2 may be formed as single layers or multilayers composed of any one or a combination of Mo, Al, Cr, Au, Ti, Ni, Nd, and Cu.

The second planarization film 180 may be disposed on the second anode connection electrodes ANDE2. The second planarization film 180 may be formed as an organic film composed of an acrylic resin, an epoxy resin, a phenolic resin, a polyamide resin, or a polyimide resin.

The light-emitting element layer EML, which includes light-emitting elements LEL and a bank 190, may be disposed on the second planarization film 180. Each of the light-emitting elements LE May include a pixel electrode 171, a light-emitting layer 172, and a common electrode 173.

Pixel electrodes 171 may be disposed on the second planarization film 180. The pixel electrodes 171 may be connected to the second anode connection electrodes ANDE2 through third connection contact holes ANCT3, which penetrate the second planarization film 180.

In a top emission structure where the light-emitting layers 172 emit light in the direction of common electrodes 173 with respect to the light-emitting layers 172, the pixel electrodes 171 may be formed using a highly reflective metallic material such as a titanium (Ti)/aluminum (Al)/Ti stack, an indium tin oxide ("ITO")/Al/ITO, an ITO/silver (Ag)/ITO stack, an Ag-palladium (Pd)—Cu ("APC") alloy, or an ITO/APC/ITO stack.

The bank 190, which defines first and second light-emitting units EA1 and EA2, may be disposed on the second planarization film 180 to partition the pixel electrodes 171. The bank 190 may be positioned to cover the edges of the pixel electrodes 171. The bank 190 may be formed as an organic film composed of an acrylic resin, an epoxy resin, a phenolic resin, a polyamide resin, or a polyimide resin.

The first and second light-emitting units EA1 and EA2 represent regions where the pixel electrodes 171, the light-emitting layers 172, and the common electrodes 173 are sequentially stacked, and where positive charges from the pixel electrodes 171 and electrons from the common electrodes 173 recombine in the light-emitting layers 172 to emit light.

The light-emitting layers 172 may be disposed on the pixel electrodes 171 and the bank 190. The light-emitting layers 172 may include an organic material and may emit light of a particular color. In an embodiment, for example, the light-emitting layers 172 may include hole transport layers, organic material layers, and electron transport layers.

The common electrodes 173 may be disposed on the light-emitting layers 172. The common electrodes 173 may be positioned to cover the light-emitting layers 172. The common electrodes 173 may be common layers that are formed in common in the first and second light-emitting units EA1 and EA2.

In the top emission structure, the common electrodes 173 may be formed of or include a transparent conductive material ("TCO") capable of transmitting light therethrough, such as ITO or indium zinc oxide ("IZO"), or a semi-transmissive metal material such as an alloy of magnesium (Mg) and Ag. When the common electrodes 173 are formed of or include a semi-transmissive metal material, the efficiency of light emission can be improved due to micro-cavities.

Spacers 191 may be disposed on the bank 190. The spacers 191 may support a mask during the fabrication of the light-emitting layers 172. The spacers 191 may be formed as organic films composed of an acrylic resin, an epoxy resin, a phenolic resin, a polyamide resin, or a polyimide resin.

In some embodiments, the display panel 100 may further include a capping layer CPL, which is disposed on the common electrodes 173. The capping layer CPL may include an inorganic material. In an embodiment, for example, the capping layer CPL may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

An encapsulation layer TFEL may be disposed on the common electrodes 173. The encapsulation layer TFEL may include at least one inorganic film to prevent the penetration of oxygen or moisture. The encapsulation layer TFEL may also include at least one organic film to protect the light-emitting element layer EML against a foreign material such as dust. In an embodiment, for example, the encapsulation layer TFEL may include a first encapsulation inorganic film TFE1, an encapsulation organic film TFE2, and a second encapsulation inorganic film TFE3.

The first encapsulation inorganic film TFE1 may be disposed on the common electrodes 173, the encapsulation organic film TFE2 may be disposed on the first encapsulation inorganic film TFE1, and the second encapsulation inorganic film TFE3 may be disposed on the encapsulation organic film TFE2. In an embodiment, for example, the first and second encapsulation inorganic films TFE1 and TFE3 may be formed as multifilm in which one or more inorganic films, such as a silicon nitride layer, a silicon oxynitride layer, a silicon oxide layer, a titanium oxide layer, and/or an aluminum oxide layer, are alternately stacked. The encapsulation organic film TFE2 may be an organic film composed of an acrylic resin, an epoxy resin, a phenolic resin, a polyamide resin, or a polyimide resin.

The touch sensing layer TDL may be disposed on the encapsulation layer TFEL. The touch sensing layer TDL may include a first touch insulating film TINS1, connection electrodes BE, a second touch insulating film TINS2, driving electrodes TE, sensing electrodes RE, and a third touch insulating film TINS3.

The first touch insulating film TINS1 may be disposed on the encapsulation layer TFEL. The first touch insulating film TINS1 may be formed as an inorganic film, such as a silicon nitride layer, a silicon oxynitride layer, a silicon oxide layer, a titanium oxide layer, or an aluminum oxide layer.

The connection electrodes BE may be disposed on the first touch insulating film TINS1. The connection electrodes BE may be formed as single layers or multilayers composed of any one or a combination of Mo, Al, Cr, Au, Ti, Ni, Nd, and Cu.

The second touch insulating film TINS2 may be disposed on the connection electrodes BE. The second touch insulating film TINS2 may be formed as an inorganic film, such as a silicon nitride layer, a silicon oxynitride layer, a silicon oxide layer, a titanium oxide layer, or an aluminum oxide layer. Alternatively, the second touch insulating film TINS2 may be formed as an organic film composed of an acrylic resin, an epoxy resin, a phenolic resin, a polyamide resin, or a polyimide resin.

The driving electrodes TE and the sensing electrodes RE may be disposed on the second touch insulating film TINS2. The driving electrodes TE and the sensing electrode RE may be formed as single layers or multilayers composed of any one or a combination of Mo, Al, Cr, Au, Ti, Ni, Nd, and Cu.

The driving electrodes TE and the sensing electrodes RE may overlap with the connection electrodes BE in the third direction DR3. The driving electrodes TE may be connected to the connection electrodes BE through touch contact holes TCNT1, which penetrate the first touch insulating film TINS1.

The third touch insulating film TINS3 may be disposed on the driving electrodes TE and the sensing electrodes RE. The third touch insulating film TINS3 may planarize steps formed by the driving electrodes TE, the sensing electrodes RE, and the connection electrodes BE. The third touch insulating film TINS3 may be formed as an organic film composed of an acrylic resin, an epoxy resin, a phenolic resin, a polyamide resin, or a polyimide resin.

The display panel 100 may have a thickness of about 20 μm to about 50 μm. Preferably, the display panel 100 may have a thickness of about 30 μm.

Figure 6:
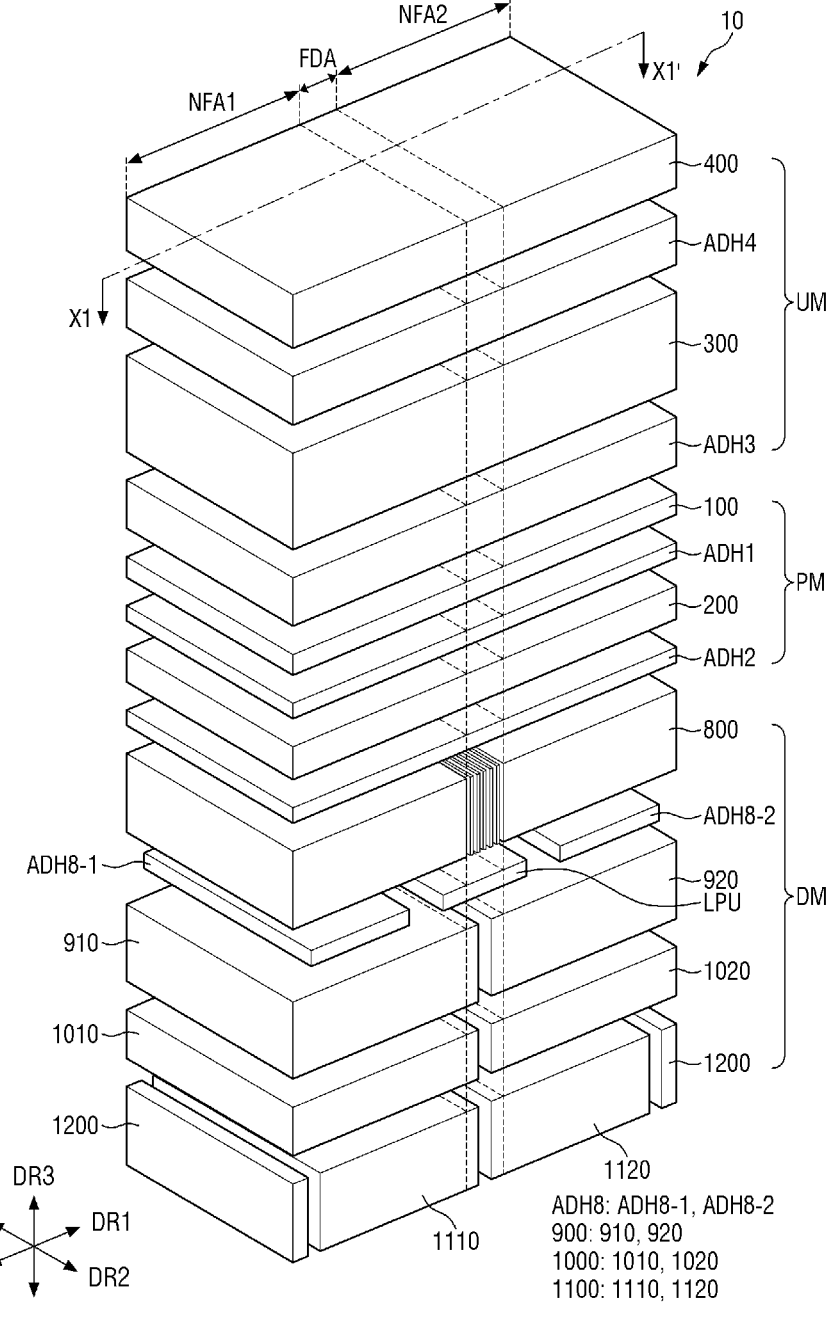
FIG. 6 is an exploded perspective view of a display device according to an embodiment of the present disclosure.
Figure 7:
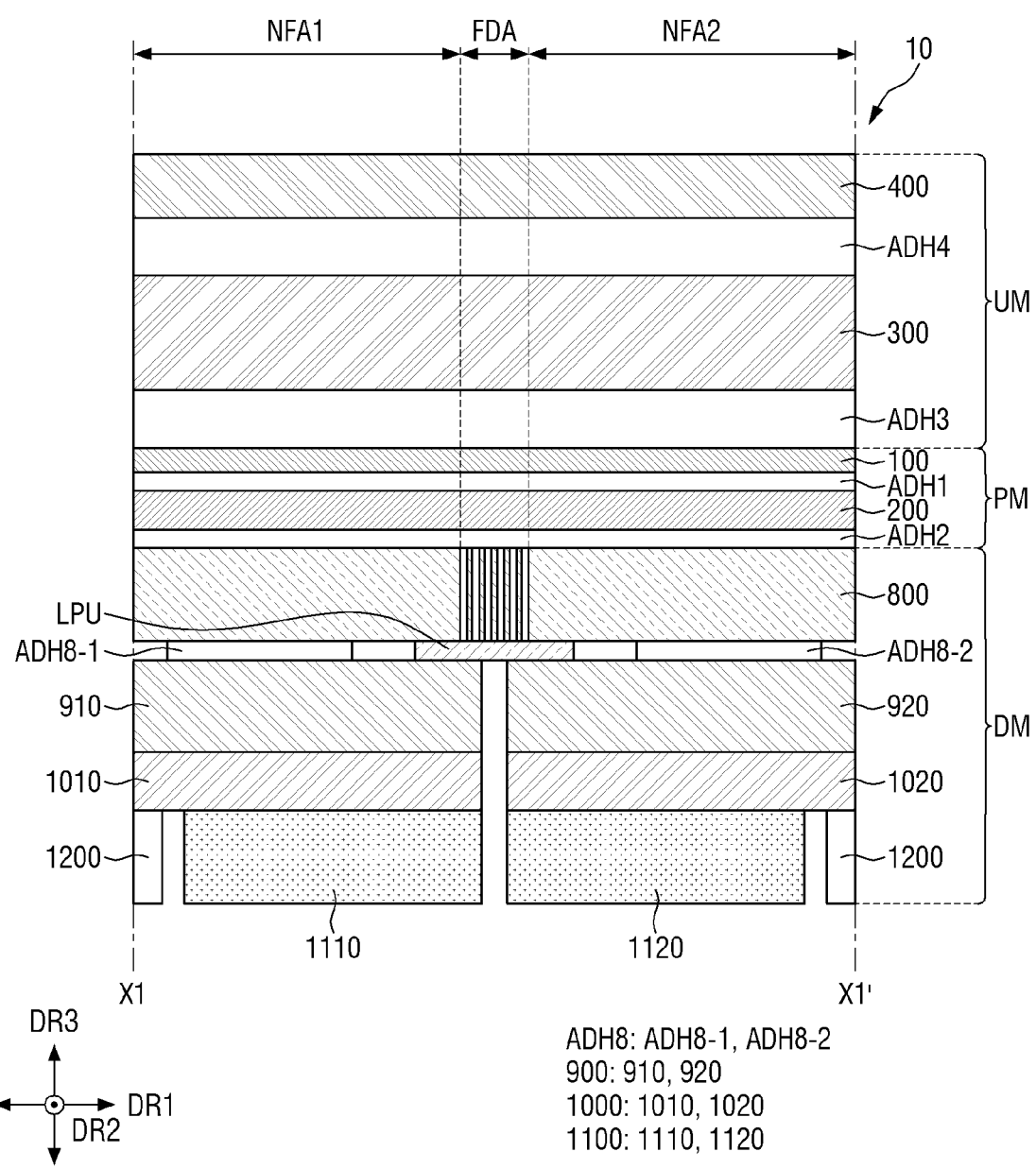
FIG. 7 is a cross-sectional view taken along line X1-X1' of FIG. 6.
Figure 8:
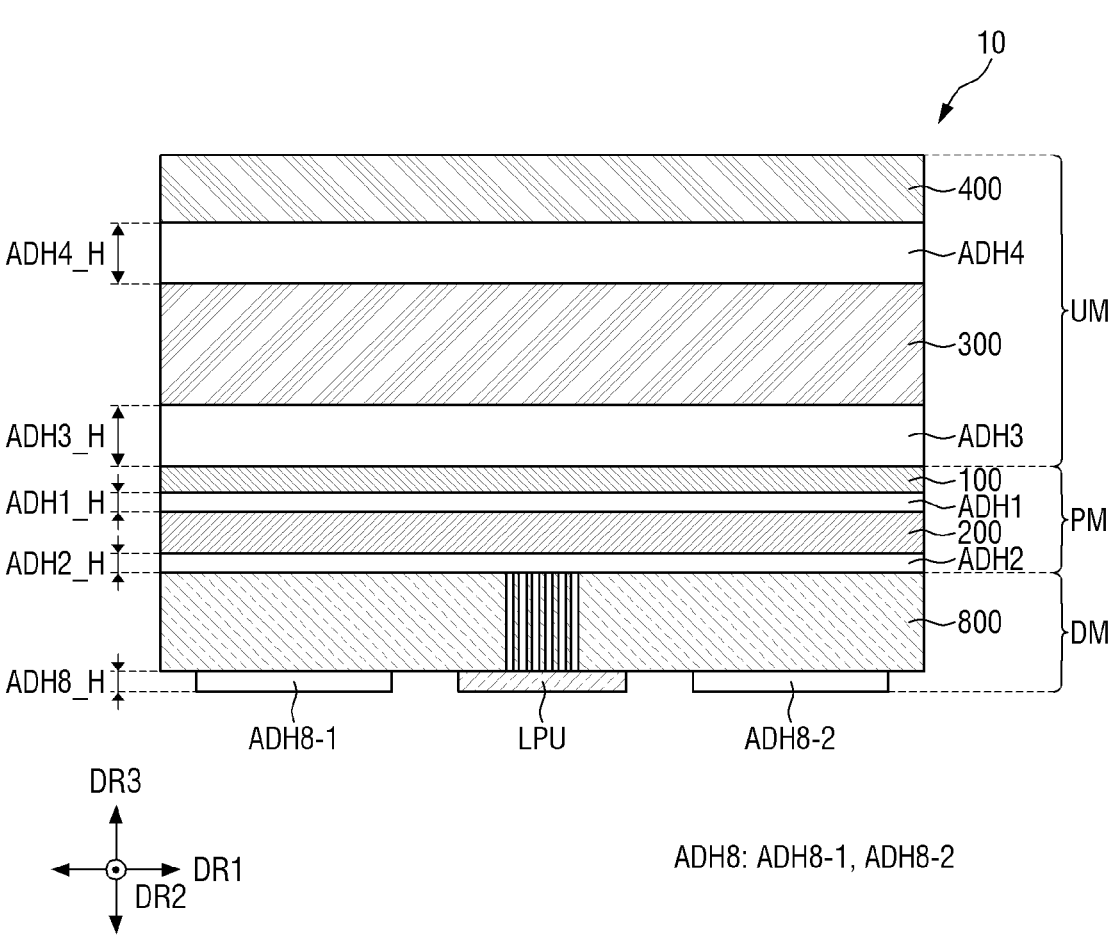
FIG. 8 is a cross-sectional view illustrating a part of the display device of FIG. 6.
Figure 9:
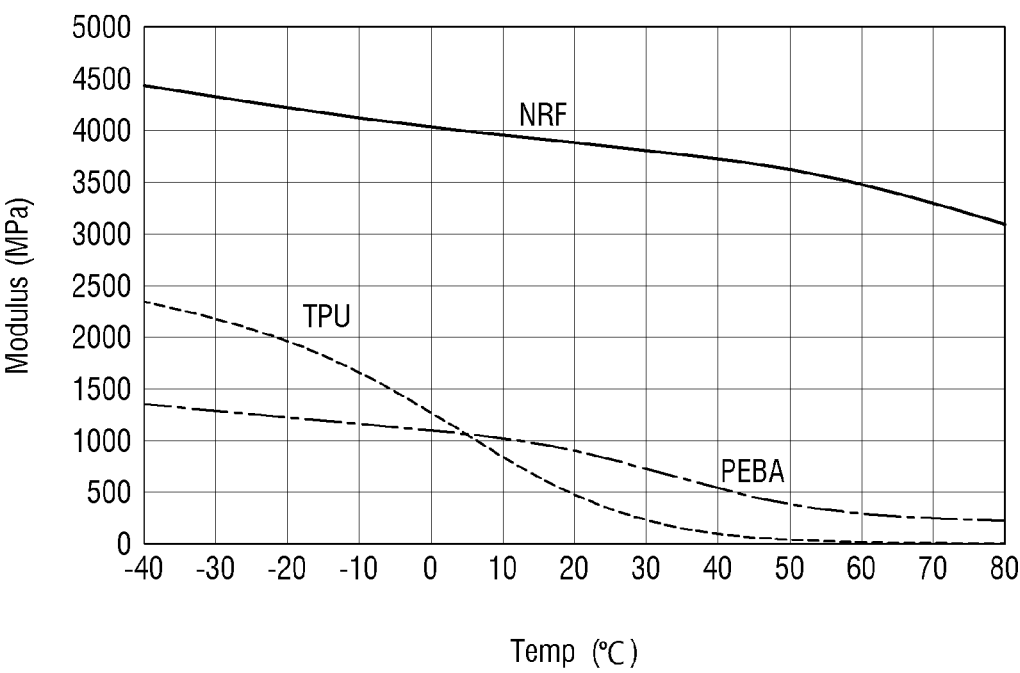
FIG. 9 is a graph comparing the modulus values of various materials according to temperature.

FIG. 6 is an exploded perspective view of a display device according to an embodiment of the present disclosure. FIG. 7 is a cross-sectional view taken along line X1-X1' of FIG. 6. FIG. 8 is a cross-sectional view illustrating a part of the display device of FIG. 6. FIG. 9 is a graph comparing the modulus values of various materials according to temperature.

Referring to FIGS. 6 through 9, a display device 10 may include a panel member PM, an upper member UM, and a lower member DM. The panel member PM may include a display panel 100, a panel lower film 200, a first adhesive member ADH1, and a second adhesive member ADH2. The upper member UM may include an elastic member 300, a first rigid member 400, a third adhesive member ADH3, and a fourth adhesive member ADH4. The lower member DM may include a panel support member 800, a lower visibility prevention member LPU, a digitizer member 900, a metal support member 1000, a buffer member 1100, anti-penetration members 1200, and an eighth adhesive member ADH8.

The display panel 100 has already been described above with reference to FIG. 5, and thus, a detailed description thereof will be omitted.

The panel lower film 200 may be disposed on the rear surface of the display panel 100. The panel lower film 200 may support the display panel 100 and protect the rear surface of the display panel 100. In an embodiment, for example, the display panel 100 may include a flexible material and may thus be easily deformed or susceptible to an external impact when being moved. As the panel lower film 200 is disposed on the rear surface of the display panel 100, the movement of the panel member PM and the coupling of the panel member PM to another member can be facilitated.

The panel lower film 200 may have a thickness of about 30 μm to about 70 μm. Preferably, the panel lower film 200 may have a thickness of about 50 μm.

In some embodiments, the panel lower film 200 may include a plastic material such as polyethylene terephthalate (PET) or polyimide. FIGS. 6 and 7 illustrate that the panel lower film 200 is disposed even in a folding area FDA of the display device 10, but the present disclosure is not limited thereto. Alternatively, the panel lower film 200 may be removed from the folding area FDA of the display device 10 to enable the display device 10 to be smoothly foldable.

The first adhesive member ADH1 may be disposed on the rear surface of the display panel 100. In an embodiment, for example, the first adhesive member ADH1 may be disposed between the display panel 100 and the panel lower film 200. The display panel 100 and the panel lower film 200 may be coupled to each other through the first adhesive member ADH1.

The second adhesive member ADH2 may be disposed on the rear surface of the panel lower film 200. In an embodiment, for example, the second adhesive member ADH2 may be disposed between the panel lower film 200 and the lower member DM. The panel lower film 200 and the lower member DM may be coupled to each other through the second adhesive member ADH2.

The first and second adhesive members ADH1 and ADH2 may include transparent adhesives such as pressure sensitive adhesives ("PSAs") or optically clear adhesives ("OCAs"). The first and second adhesive members ADH1 and ADH2 may include an acrylic adhesive material.

The upper member UM may include various protective members for protecting the display panel 100. In an embodiment, for example, when the display device 10 is configured to be out-folded, the upper member UM may include protective members for protecting the display panel 100 from external impacts because the display surface of the display panel 100 is always exposed to the outside.

External impacts may include impacts from pointed objects and impacts from blunt objects. For example, impacts from pointed objects, such as needles, may result in scratches or surface damages on the impacted surfaces, or even cause deep damages in the thickness direction of components with low hardness or rigidity. On the other hand, impacts from blunt objects, such as steel balls, carry high momentum, leading to the transmission of shock not only to the impacted surfaces but also throughout all the underlying layers.

The elastic member 300 may be positioned on the front surface of the display panel 100. The elastic member 300 may serve a shock-absorbing function to protect the display panel 100 from external impacts. For example, the elastic member 300 may mitigate impacts caused by blunt objects. With its high elasticity, the elastic member 300 can delay the transmission of high momentum resulting from impacts from blunt objects and can thereby minimize the impact force applied to the display panel 100. Consequently, the display device 10 can have excellent resistance to external impacts.

The elastic member 300 may have a thickness of about 100 μm to about 200 μm. Preferably, the elastic member 300 may have a thickness of about 150 μm.

In an embodiment, for example, the elastic member 300 may include thermoplastic polyurethane (TPU). In another example, the elastic member 300 may include polyether block amide (PEBA). As the elastic member 300 includes at least one of TPU or PEBA, the elastic member 300 can minimize the impact force applied to the display panel 100. Consequently, the display device 10 can have excellent resistance to external impacts.

In an embodiment, for example, referring to FIG. 9, a non-retardation film NRF containing PET has a high modulus value of about 4 gigapascals (GPa) at room temperature.

Here, the term "modulus value" refers to Young's modulus and is measured, for example, by ASTM D638 or ASTM D3039.

On the contrary, the elastic member 300, which contains TPU and/or PEBA, may have a low modulus value of less than about 1 GPa at room temperature. Accordingly, the elastic member 300 with TPU or PEBA can minimize the impact force applied to the display panel 100 due to its high elasticity and resilience. Consequently, the display device 10 can have excellent resistance to external impacts.

Furthermore, the elastic member 300 with PEBA may exhibit relatively small variations in modulus value with temperature changes. In an embodiment, for example, the elastic member 300 with PEBA may have a modulus value difference of about 1 GPa within the range of temperatures of −40° C. to +80° C. In contrast, the elastic member 300 with TPU may have a modulus value difference of about 2.5 GPa within the same temperature range, and the non-retardation film NRF with PET may have a modulus value difference of about 1.5 GPa within the same temperature range. Thus, the elastic member 300 with PEBA can possess excellent mechanical properties regardless of temperature variations.

In some embodiments, the elastic member 300 may include a dilatant. A dilatant is a non-Newtonian fluid that exhibits an increase in shear stress variation to shear rate increases as the shear stress or rate increases. The viscosity of the dilatant may also rise with an increase in shear stress or rate. By including the dilatant in the elastic member 300, the impact force applied to the display panel 100 can be minimized. A method for minimizing the impact force when the elastic member 300 contains the dilatant will be described later with reference to FIG. 16.

The first rigid member 400 may be disposed on the elastic member 300. The first rigid member 400 may serve an impact mitigation function to protect the display panel 100 from external impacts. For example, the first rigid member 400 can mitigate impacts from pointed objects. The first rigid member 400 may have a high rigidity and may thus be able to minimize scratches or deep damages that may be caused by pointed objects. Accordingly, the display device 10 can have high resistance to external impacts.

The first rigid member 400 may include a material with a high rigidity, high flexibility, and high scratch resistance. The first rigid member 400 may include at least one of PET, polyimide, and ultra-thin glass (UTG), which refers to glass with a thickness of about 500 μm.

The first rigid member 400 may have a thickness of about 70 μm to about 100 μm. Preferably, the first rigid member 400 may have a thickness of about 80 μm.

The first rigid member 400 is illustrated as being a single layer, but the present disclosure is not limited thereto. Alternatively, the first rigid member 400 may have a multilayer structure consisting of two or more layers.

In some embodiments, the first rigid member 400 may have a greater modulus value than the elastic member 300. In an embodiment, for example, the first rigid member 400 may have a modulus value of about 10 GPa or 15 GPa, and the elastic member 300 may have a modulus value of less than 1 GPa.

As the first rigid member 400 has a modulus value of 10 GPa or greater, impacts from pointed objects can be mitigated. Furthermore, as the first rigid member 400 has a modulus value of 15 GPa or less, the bending stress applied to the display device 10 when the display device 10 is being bent can be minimized.

In some embodiments, the first rigid member 400 may include a coating layer HCL (of FIG. 13) on its top surface. Due to the presence of the coating layer HCL, the first rigid member 400 can serve dent- and scratch-resistance functions. The coating layer HCL may be a heat-treated hard coating layer.

The third adhesive member ADH3 may be disposed on the rear surface of the elastic member 300. In an embodiment, for example, the third adhesive member ADH3 may be disposed between the elastic member 300 and the panel member PM. The elastic member 300 and the panel member PM may be coupled to each other through the third adhesive member ADH3.

The fourth adhesive member ADH4 may be disposed on the rear surface of the first rigid member 400. In an embodiment, for example, the fourth adhesive member ADH4 may be disposed between the first rigid member 400 and the elastic member 300. The first rigid member 400 and the elastic member 300 may be coupled to each other through the fourth adhesive member ADH4.

The third and fourth adhesive members ADH3 and ADH4 may include transparent adhesives such as PSAs or OCAs. The third and fourth adhesive members ADH3 and ADH4 may include an acrylic adhesive material.

In some embodiments, at least one of the third and fourth adhesive members ADH3 and ADH4 may include a dilatant. As at least one of the third and fourth adhesive members ADH3 and ADH4 includes a dilatant, the impact force applied to the display panel 100 can be minimized.

The panel support member 800 may be disposed on the rear surface of the panel lower film 200. The panel support member 800 may be a rigid member whose shape or volume does not easily change under external pressure. Accordingly, the panel support member 800 can support the display panel 100.

The panel support member 800 may have a thickness of about 100 μm to about 150 μm. Preferably, the panel support member 800 may have a thickness of about 120 μm. The panel support member 800 may include a polymer containing carbon fiber or glass fiber. In an embodiment, for example, in a case where the fiber yarn of the panel support member 800 includes carbon fiber, the resin may be epoxy, polyester, polyamide, polycarbonate, polypropylene, polybutylene, or vinyl ester. In another example, in a case where the fiber yarn of the panel support member 800 includes glass fiber, the resin may be epoxy, polyester, polyamide, or vinyl ester.

In a case where the panel support member 800 is formed of or include a polymer containing carbon fiber or glass fiber, the panel support member 800 can allow the passage of the magnetic field or electromagnetic signals of the digitizer member 900 therethrough. Accordingly, a panel support member 800 capable of supporting the display panel 100 without lowering the touch sensitivity of the digitizer member 900 can be provided.

Alternatively, the panel support member 800 may be a metal plate. In an embodiment, for example, the panel support member 800 may be a metal plate formed of or include a metal or a metal alloy. The panel support member 800 may include Cu, Al, stainless steel ("SUS"), and/or an alloy thereof, but the present disclosure is not limited thereto.

The panel support member 800 may include a lattice pattern, which is disposed in the folding area FDA that allows the panel support member 800 to be easily foldable in the folding area FDA. As the panel support member 800 includes the lattice pattern, the panel support member 800 becomes easily foldable when the display device 10 is being folded.

The panel support member 800 may include a folding portion, a first non-folding portion, and a second non-folding portion. The folding portion may be disposed in the folding area FDA, the first non-folding portion may be disposed in a first non-folding area NFA1, and the second non-folding portion may be disposed in a second non-folding area NFA2.

The folding portion may be a part of the panel support member 800 that is folded along with the display device 10. The folding portion may be disposed between the first and second non-folding portions in the first direction DR1. The folding portion may include a plurality of bars and a plurality of slits between the bars.

The bars may include horizontal bars, which extend in the first direction DR1, and vertical bars, which extend in the second direction D2. The slits may be holes penetrating the panel support member 800 in the third direction DR3. The slits may extend in the second direction DR2. As the folding portion includes the slits, the folding portion can have flexibility. That is, the folding portion may become stretchable in the first direction DR1 when the display device 10 is being folded.

The first and second non-folding portions may be parts of the panel support member 800 that are not folded along with the display device 10. The first non-folding portion may be disposed on one side of the folding portion in the first direction D1, and the second non-folding portion may be disposed on the other side of the folding portion in the first direction DR1.

The lower visibility prevention member LPU may be disposed on the rear surface of the panel support member

800. The lower visibility prevention member LPU may be positioned to overlap with the folding area FDA. The lower visibility prevention member LPU may be disposed in the same layer as the eighth adhesive member ADH8. The lower visibility prevention member LPU may be disposed between first and second sub-adhesive members ADH8-1 and ADH8-2. The lower visibility prevention member LPU may prevent the lattice pattern of the panel support member 800 from becoming visible from the outside. The lower visibility prevention member LPU may include a flexible material and may thus be able to reduce the folding stress of the display device 10.

The digitizer member 900 may include first and second digitizer members 910 and 920. The first and second digitizer members 910 and 920 may be disposed on the rear surface of the panel support member 800.

The first and second digitizer members 910 and 920 may not be disposed in the folding area FDA to reduce the folding stress of the display device 10. The first digitizer member 910 may be disposed in the first non-folding area NFA1, and the second digitizer member 920 may be disposed in the second non-folding area NFA2. The gap between the first and second digitizer members 910 and 920 may overlap with the folding area FDA and may have a width smaller than the width of the folding area FDA. Here, the width of the folding area FDA may refer to the length of the folding area FDA in the first direction DR1.

The first and second digitizer members 910 and 920 may include electrode patterns to detect the approach or contact of an electronic pen, such as a stylus pen, which supports the electromagnetic resonance ("EMR") method. The first and second digitizer members 910 and 920 may detect the magnetic field or electromagnetic signals emitted from the electronic pen based on the electrode patterns. The point detected with the strongest magnetic field or electromagnetic signal may be determined as touch coordinates.

Magnetic metal powder may be placed on the back surfaces of the first and second digitizer members 910 and 920. In this case, the magnetic field or electromagnetic signals passing through the first and second digitizer members 910 and 920 may flow into the interior of the magnetic metal powder. Consequently, due to the presence of the magnetic metal powder, the emission of the magnetic field or electromagnetic signals from the rear surfaces of the first and second digitizer members 910 and 920 to the rear surface of the display device 10 can be reduced.

The metal support member 1000 may include first and second metal support members 1010 and 1020. The first metal support member 1010 may be disposed on the rear surface of the first digitizer member 910, and the second metal support member 1020 may be disposed on the rear surface of the second digitizer member 920.

The first and second metal support members 1010 and 1020 may not be disposed in the folding area FDA to reduce the folding stress of the display device 10. The first metal support member 1010 may be disposed in the first non-folding area NFA1, and the second metal support member 1020 may be disposed in the second non-folding area NFA2. The gap between the first and second metal support members 1010 and 1020 may overlap with the folding area FDA and may have a width smaller than the width of the folding area FDA.

The first and second metal support members 1010 and 1020 may include a material with a high rigidity to support the first and second digitizer members 910 and 920. In an embodiment, for example, the first and second metal support members 1010 and 1020 may include SUS, such as SUS316.

The buffer member 1100 may include first and second buffer members 1110 and 1120. The first and second buffer members 1110 and 1120 may absorb external impacts to prevent damage to the panel support member 800 and the digitizer member 900. The first and second buffer members 1110 and 1120 may include a material with elasticity, such as rubber, a urethane-based material, or a foamed sponge formed from an acrylic material.

The first buffer member 1110 may be disposed on the rear surface of the first metal support member 1010, and the second buffer member 1120 may be disposed on the rear surface of the second metal support member 1020. The first and second buffer members 1110 and 1120 may not be disposed in the folding area FDA to reduce the folding stress of the display device 10. The first buffer member 1110 may be disposed in the first non-folding area NFA1, and the second buffer member 1120 may be disposed in the second non-folding area NFA2. The gap between the first and second buffer members 1110 and 1120 may overlap with the folding area FDA and may have a width smaller than the width of the folding area FDA.

The anti-penetration members 1200 may be disposed on the rear surfaces of the first and second metal support members 1010 and 1020. The anti-penetration members 1200 may be disposed along the edges of the first and second metal support members 1010 and 1020. The anti-penetration members 1200 are illustrated as being positioned only on the edges of the first and second metal support members 1010 and 1020, but the present disclosure is not limited thereto. Alternatively, the anti-penetration members 1200 may be positioned to surround the entire planes of the first and second buffer members 1110 and 1120 in the first and second directions DR1 and DR2.

The anti-penetration members 1200 may be waterproof or dustproof tapes or materials that are attached to the front of frames (not illustrated) or housings (not illustrated) that are placed on the rear surfaces of the metal support member 1000 and the buffer member 1100. As a result, the anti-penetration members 1200 can prevent moisture or dust from infiltrating into the display device 10. That is, a waterproof/dustproof display device 10 can be provided.

Alternatively, the anti-penetration members 1200 may be positioned to overlap with magnets, which are for maintaining the folding of the display device 10, in the third direction DR3, instead of surrounding the first and second buffer members 1110 and 1120. In this case, the anti-penetration members 1200 can serve as magnetic shielding members that can shield the magnets' magnetic influence on the digitizer member 900 or the display panel 100.

The eighth adhesive member ADH8 may be disposed on the rear surface of the panel support member 800. In an embodiment, for example, the eighth adhesive member ADH8 may be disposed between the panel support member 800 and the digitizer member 900. The panel support member 800 and the digitizer member 900 may be coupled to each other through the eighth adhesive member ADH8.

The eighth adhesive member ADH8 may include the first and second sub-adhesive members ADH8-1 and ADH8-2. The first and second sub-adhesive members ADH8-1 and ADH8-2 may be disposed on opposite sides of the lower visibility prevention member LPU. In an embodiment, for example, the first sub-adhesive member ADH8-1 may be disposed on the first digitizer member 910, and the second sub-adhesive member ADH8-2 may be disposed on the second digitizer member 920.

The eighth adhesive member ADH8 may include a transparent adhesive such as a PSA or an OCA. The eighth adhesive member ADH8 may include an acrylic adhesive material.

As the first, second, third, fourth, and eighth adhesive members ADH1, ADH2, ADH3, ADH4, and ADH8 have elasticity and resilience, the first, second, third, fourth, and eighth adhesive members ADH1, ADH2, ADH3, ADH4, and ADH8 can mitigate the folding stress applied to the display device 10 when the display device 10 is being folded.

Depending on the thickness of the first, second, third, fourth, and eighth adhesive members ADH1, ADH2, ADH3, ADH4, and ADH8, the degree of stress mitigation on adjacent components may vary. In an embodiment, for example, as the thicknesses of the first, second, third, fourth, and eighth adhesive members ADH1, ADH2, ADH3, ADH4, and ADH8 increase, the stress applied to adjacent components can be further reduced.

As illustrated in FIG. 8, the thickness of the adhesive members disposed on the front surface of the display panel 100 may be greater than the thickness of the adhesive members disposed on the rear surface of the display panel 100. In an embodiment, for example, thicknesses ADH3_H and ADH4_H of the third and fourth adhesive members ADH3 and ADH4 may each be greater than each of thicknesses ADH1_H, ADH2_H, and ADH8_H of the first, second, and eighth adhesive members ADH1, ADH2, and ADH8 in the third direction DR3.

The thickness of the adhesive members disposed on the front surface of the display panel 100 may be two to five times the thickness of the adhesive members disposed on the rear surface of the display panel 100. In an embodiment, for example, the thicknesses ADH3_H and ADH4_H of the third and fourth adhesive members ADH3 and ADH4 may be, but is not limited to, about 75 μm, and the thicknesses ADH1_H, ADH2_H, and ADH8_H of the first, second, and eighth adhesive members ADH1, ADH2, and ADH8 may be, but is not limited to, about 25 μm.

As the upper member UM of the display device 10 includes the elastic member 300, which is relatively thick, and the first rigid member 400, the upper portion of the display panel 100 may experience more folding stress than the lower portion of the display panel 100. To balance the folding stress between the upper and lower portions of the display panel 100, the adhesive members on the front surface of the display panel 100 may be formed thicker than the adhesive members on the rear surface of the display panel 100.

Figure 10:
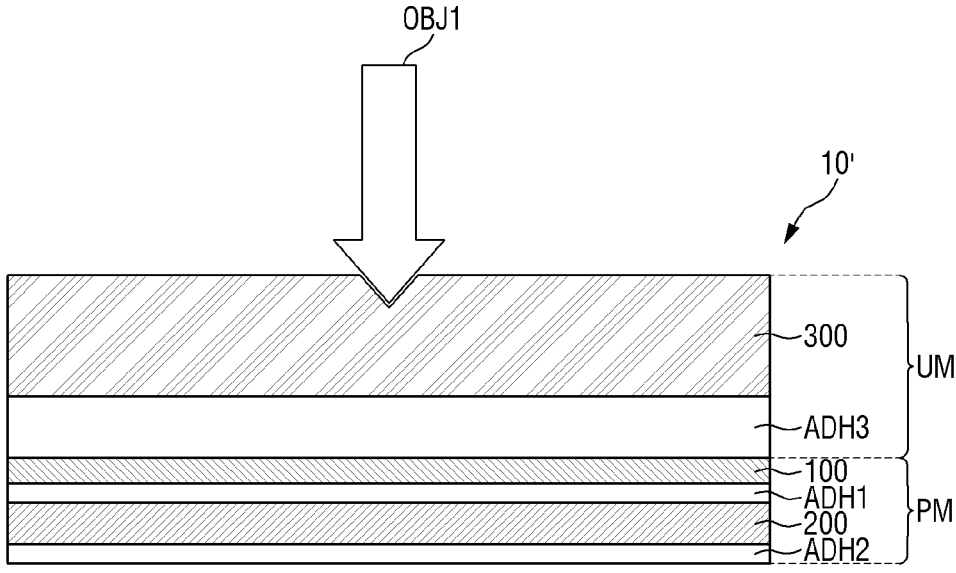
FIG. 10 is a cross-sectional view illustrating the state where an impact is applied to a first comparative-example display device by a first object.
Figure 10:
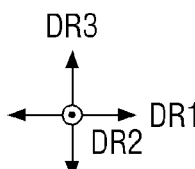
Figure 11:
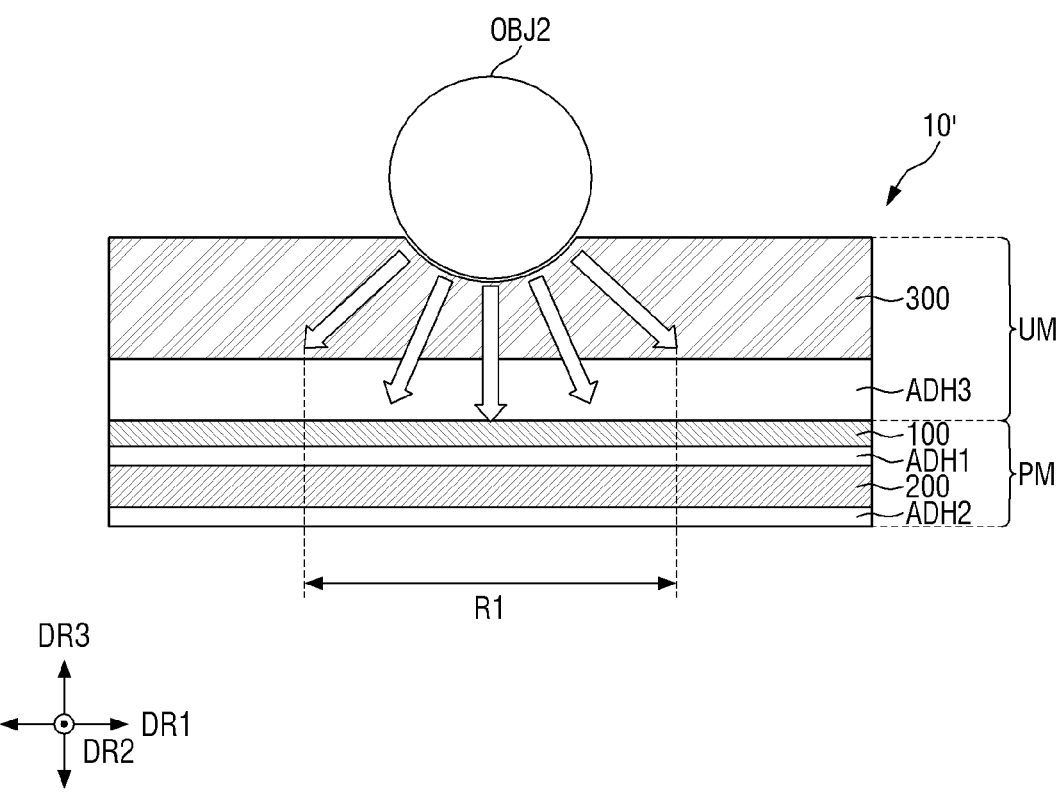
FIG. 11 is a cross-sectional view illustrating the state where an impact is applied to the first comparative-example display device by a second object.
Figure 12:
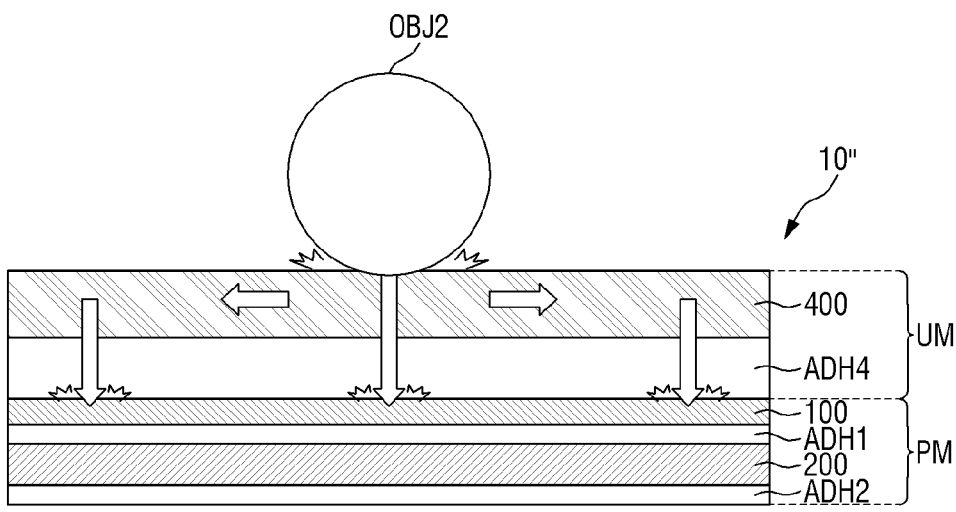
FIG. 12 is a cross-sectional view illustrating the state where an impact is applied to a second comparative-example display device by a second object.
Figure 12:
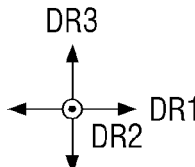
Figure 13:
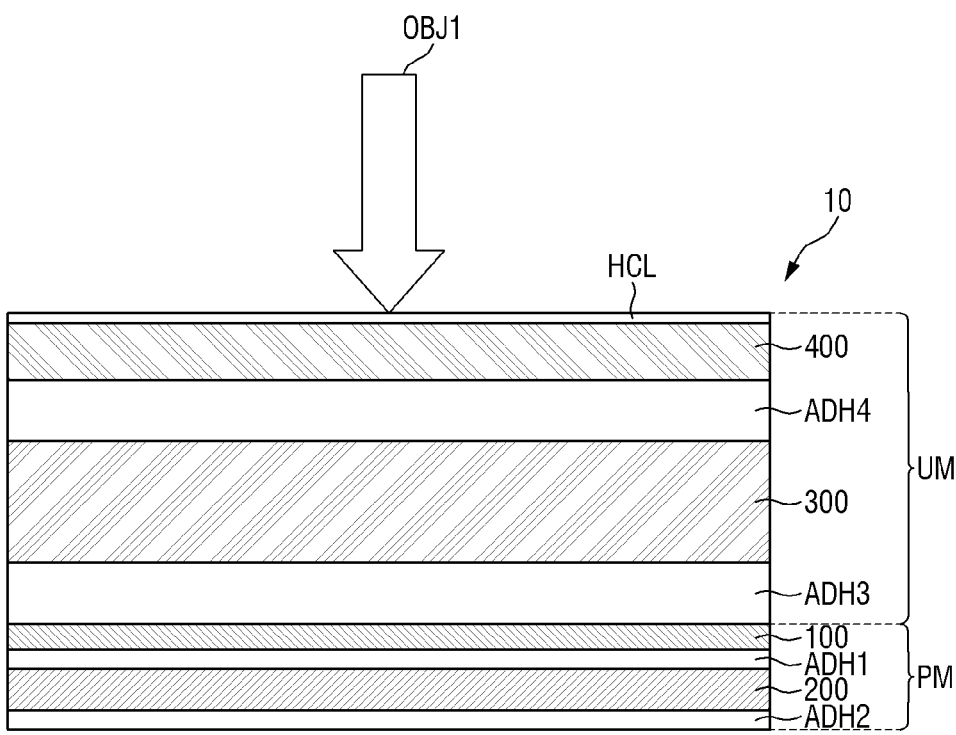
FIG. 13 is a cross-sectional view illustrating the state where an impact is applied to a display device according to an embodiment of the present disclosure by the first object.
Figure 13:
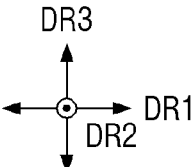
Figure 14:
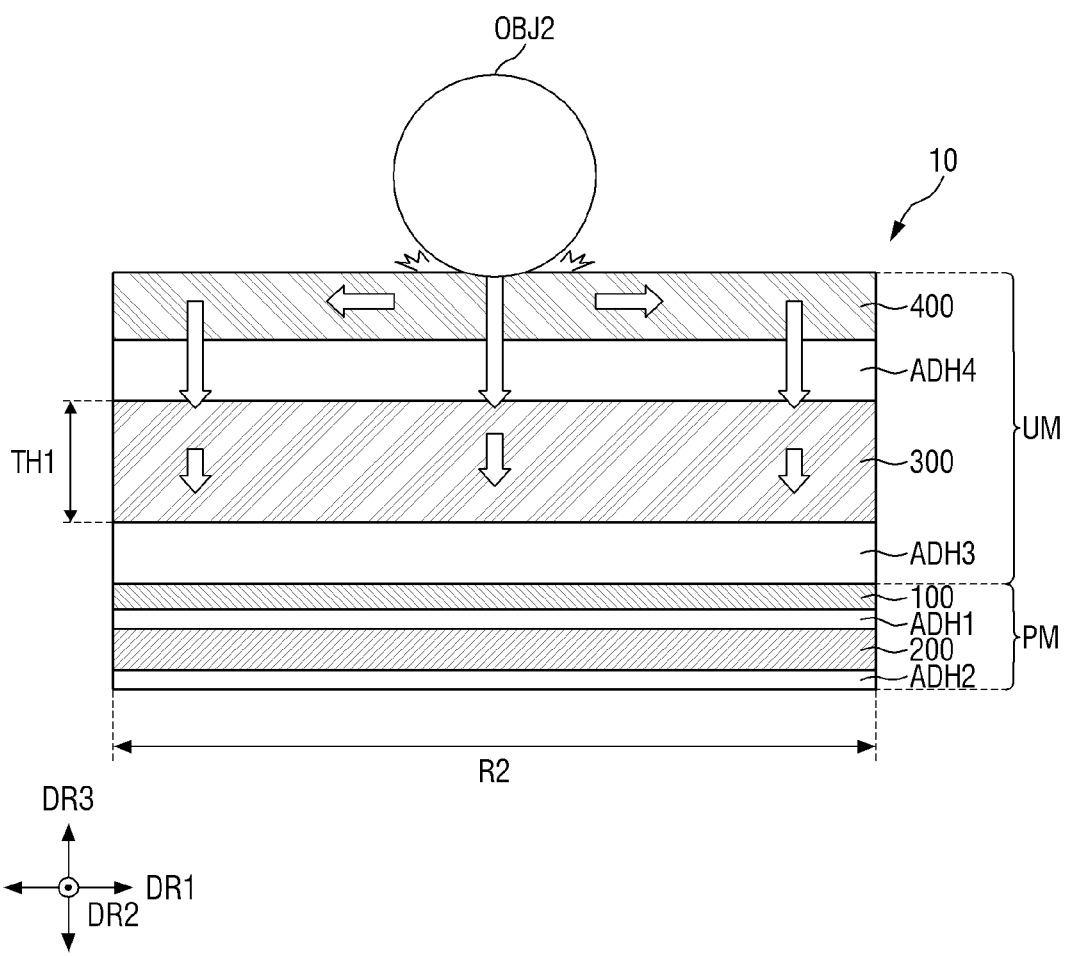
FIGS. 14 and 15 are cross-sectional views illustrating the state where an impact is applied to the display device of FIG. 6 by the second object.
Figure 15:
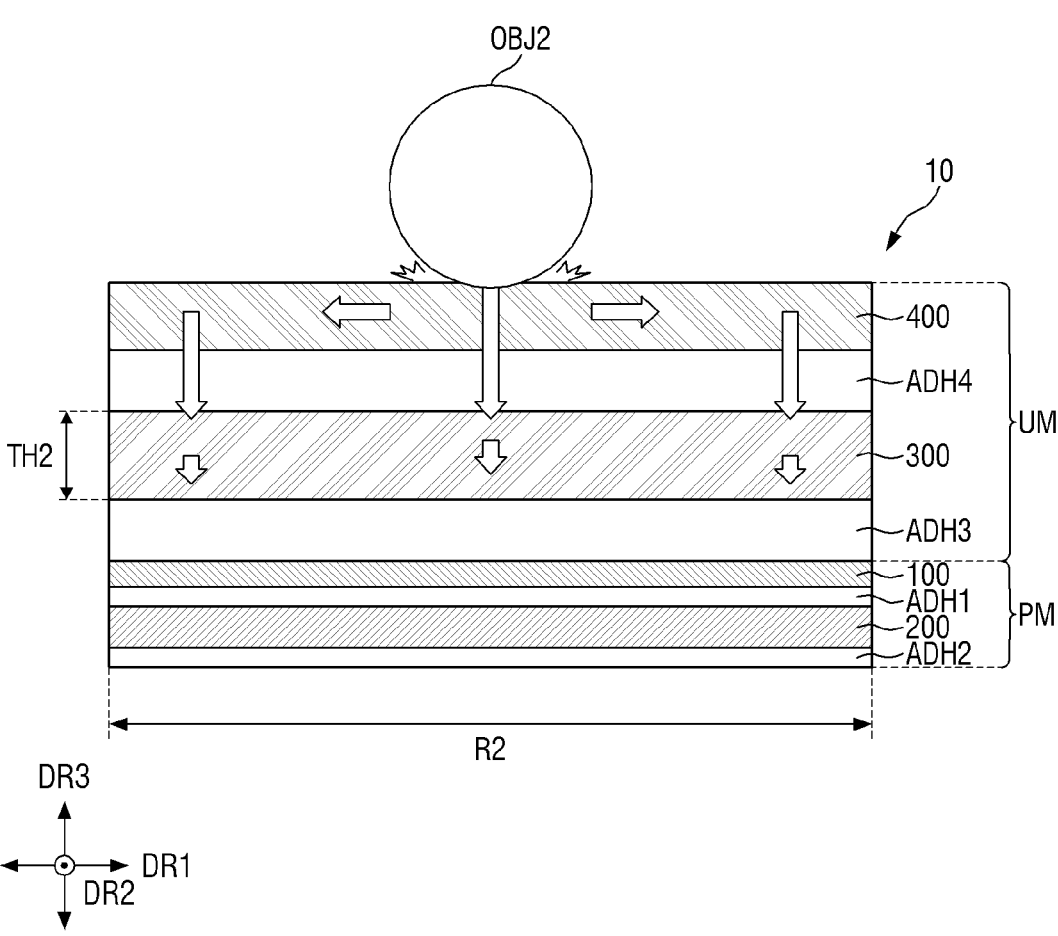

FIG. 10 is a cross-sectional view illustrating the state where an impact is applied to a first comparative-example display device by a first object. FIG. 11 is a cross-sectional view illustrating the state where an impact is applied to the first comparative-example display device by a second object. FIG. 12 is a cross-sectional view illustrating the state where an impact is applied to a second comparative-example display device by a second object. FIG. 13 is a cross-sectional view illustrating the state where an impact is applied to a display device according to an embodiment of the present disclosure by the first object. FIGS. 14 and 15 are cross-sectional views illustrating the state where an impact is applied to the display device of FIG. 6 by the second object.

Referring to FIGS. 10 through 15, the first rigid member 400 may be disposed directly on the elastic member 300. In an embodiment, for example, no other element may be interposed between the first rigid member 400 and the elastic member 300 except for the fourth adhesive member ADH4.

In this specification, when one component is described as being directly disposed on another component, it includes cases where an adhesive member is interposed between the two components, but excludes cases where elements other than the adhesive member are interposed between the two components. Here, the term "adhesive member" refers to first, second, third, fourth, and eighth adhesive members ADH1, ADH2, ADH3, ADH4, and ADH8 and fifth, sixth, and seventh adhesive members ADH5, ADH6, and ADH7.

Referring to FIG. 10, in a first comparative-example display device 10', a first rigid member 400 may not be placed on an elastic member 300. In this case, the elastic member 300 with a low modulus value may be easily damaged by a first object OBJ1, which is a pointed object.

Referring to FIG. 11, the elastic member 300 may directly experience impact from a second object OBJ2, which is a blunt object. As the elastic member 300 has a low modulus value and high elasticity and resilience, the elastic member 300 may transmit the impact received from the second object OBJ2 mostly in a vertical direction, such as the third direction (DR3), but much less in horizontal directions, such as the first and second directions DR1 and DR2. In other words, the elastic member 300 can partially reduce the impact from the second object OBJ2, but a first range R1 of the elastic member 300, which is the range of impact transmission in the horizontal directions, may be relatively narrow.

Referring to FIG. 12, in a second comparative-example display device 10", no elastic member 300 may be disposed between a display panel 100 and a first rigid member 400. In this case, the first rigid member 400, which has a high modulus value, may transmit the impact from the second object OBJ2, which is a blunt object, directly to the display panel 100.

On the contrary, referring to FIG. 13, in the display device 10, the first rigid member 400 may be disposed directly on the elastic member 300. Consequently, the impact from the first object OBJ1, which is a pointed object, can be minimized. In some embodiments, the first rigid member 400 may include the coating layer HCL on its top surface and may serve dent- and scratch-resistance functions.

Referring to FIGS. 14 and 15, in the display device 10, both the elastic member 300 and the first rigid member 400 may be disposed on the display panel 100. Consequently, the impact from the second object OBJ2, which is a blunt object, can be minimized. For example, when the second object OBJ2 hits the first rigid member 400, the first rigid member 400 may transmit the impact received from the second object OBJ2 in the horizontal directions, such as the first and second directions DR1 and DR2. Consequently, a second range R2 of the display device 10, which is the range of impact transmission in the horizontal directions, can widen.

As the second range R2 widens, the elastic member 300 can absorb the impact in the vertical direction, such as the third direction DR3, across the entire second range R2. In an embodiment, for example, the thickness of the elastic member 300 may decrease from a first thickness TH1, which is the pre-impact thickness of the elastic member 300, to a second thickness TH2, which is the post-impact thickness of the elastic member 300, due to the absorbed impact. Thus, the impact applied to the display panel 100 can be minimized by widening the range of impacts that can be absorbed by the elastic member 300. Consequently, the display device 10 can have excellent resistance to external impacts.

Figure 16:
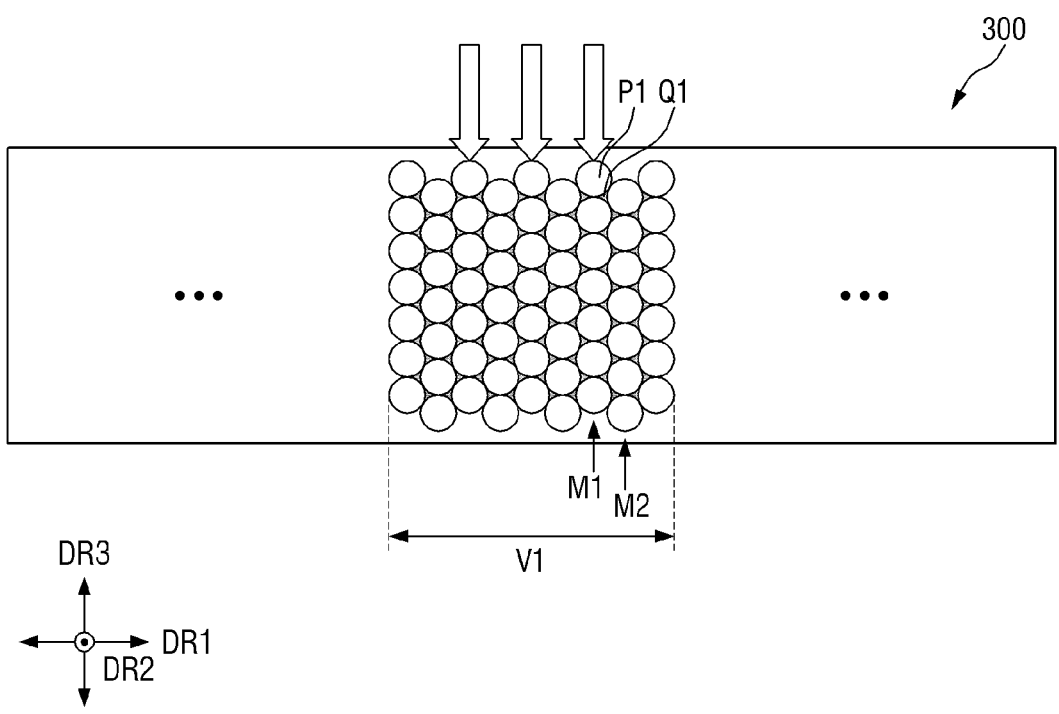
FIG. 16 is a cross-sectional view illustrating the particle distribution of an elastic member according to an embodiment of the present disclosure in the absence of external impacts.
Figure 17:
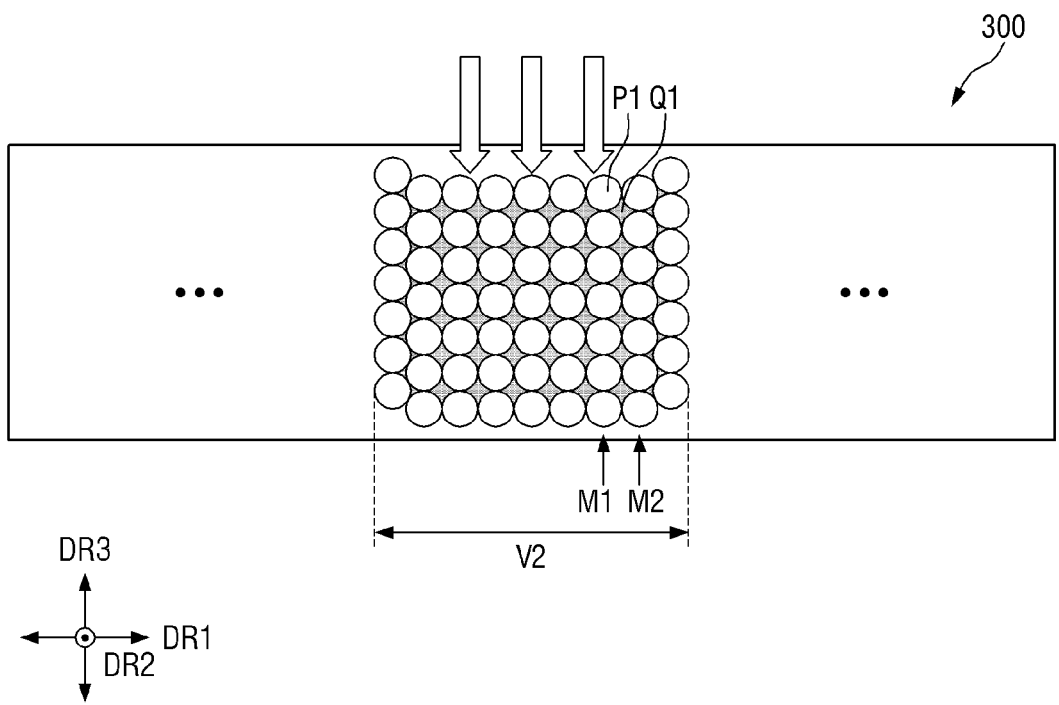
FIG. 17 is a cross-sectional view illustrating the particle distribution of the elastic member according to an embodiment of the present disclosure in the presence of external impacts.

FIG. 16 is a cross-sectional view illustrating the particle distribution of an elastic member according to an embodiment of the present disclosure in the absence of external impacts. FIG. 17 is a cross-sectional view illustrating the particle distribution of the elastic member according to an embodiment of the present disclosure in the presence of external impacts.

Referring to FIGS. 16 and 17, the elastic member 300 of the display device 10 may include a dilatant. The dilatant may include first particles P1, which exhibit the properties of a solid, and a first fluid Q1, which exhibits the properties of a liquid.

The first fluid Q1 may fill the spaces between the first particles P1. The interparticle forces maintain a minimum distance between the first particles P1, allowing the first fluid Q1 to occupy the voids between the first particles P1. For example, as illustrated in FIG. 16, the centers of the first particles P1 in a first row M1 in the third direction DR3 may not be directly aligned with, but be staggered from the centers of the first particles P1 in a second row M2, which is a row adjacent to the first row M1 in the first direction DR1.

When external forces are applied to the elastic member 300 from a particular direction, the spaces between the first particles P1 may widen, causing a temporary decrease in the density of the first fluid Q1. Consequently, attractive forces are generated to draw the first fluid Q1 into the spaces between the first particles P1. This leads to the creation of a momentary strong force caused by the generated attractive forces and the intermolecular attractive forces within the first fluid Q1. As a result, as the external forces increase, the dilatant in the elastic member 300 can generate higher forces, thereby minimizing the impact transmitted to the display panel 100.

For example, as illustrated in FIG. 17, when external impacts are applied in a top-to-bottom direction, the spacing between the first particles P1 in the first row M1 and the first particles P1 in the second row M2 may increase. During this process, the volume of the elastic member 300 may increase from a first volume V1 to a second volume V2. Consequently, the density of the first fluid Q1, situated in the spaces between the first particles P1, decreases, and attractive forces are generated to draw the first fluid Q1 into the spaces between the first particles P1. As a result, as the external impacts increase, the dilatant in the elastic member 300 can generate higher forces, thereby minimizing the impact transmitted to the display panel 100.

Display devices according to other embodiments of the present disclosure will hereinafter be described, highlighting the differences with the display devices according to the previous embodiments of the present disclosure. In the following description, the same elements will be denoted with the same reference numerals, and redundant explanations will be omitted or simplified.

Figure 18:
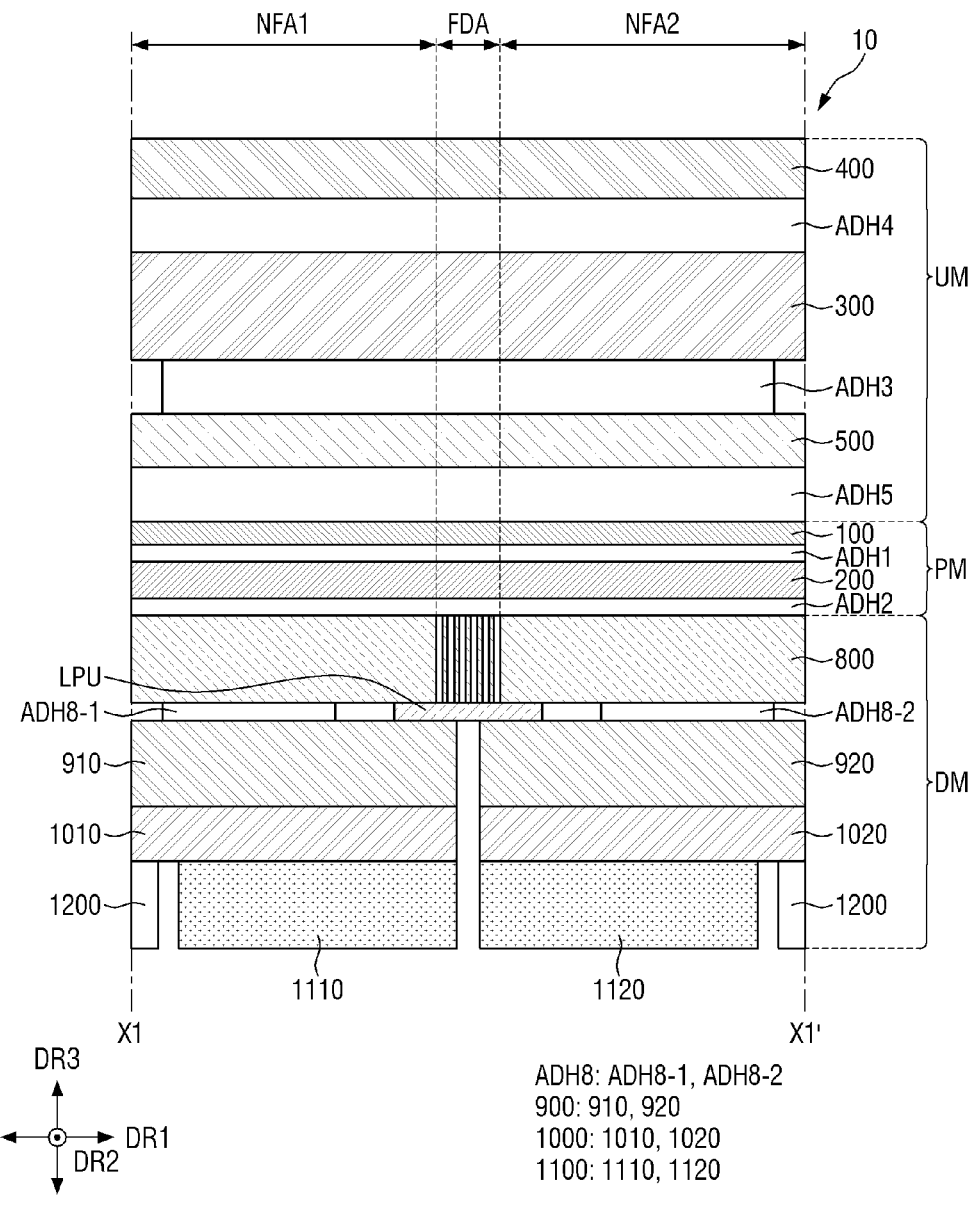
FIG. 18 is a cross-sectional view of a display device according to another embodiment of the present disclosure.
Figure 19:
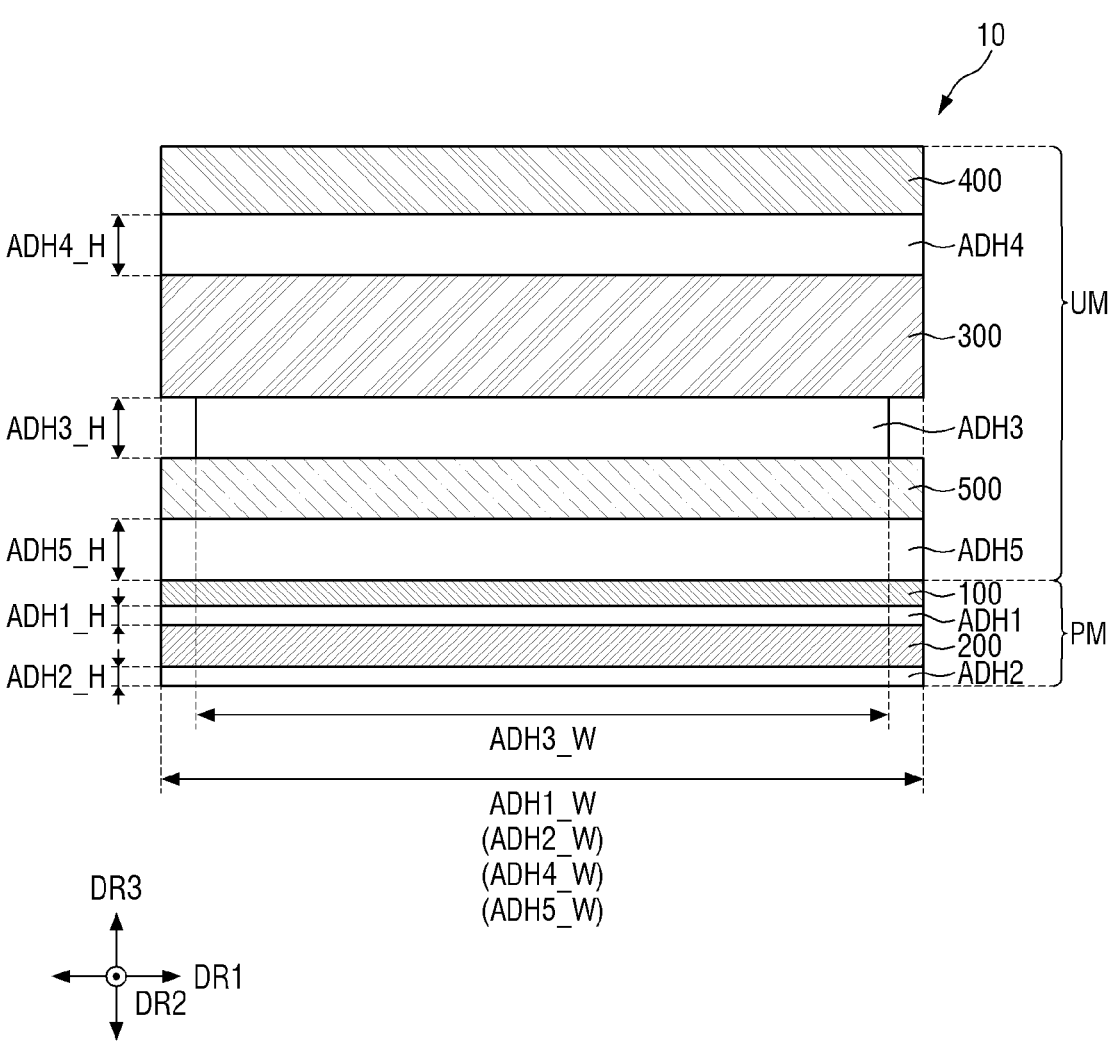
FIG. 19 is a cross-sectional view illustrating a part of the display device of FIG. 18.

FIG. 18 is a cross-sectional view of a display device according to another embodiment of the present disclosure. FIG. 19 is a cross-sectional view illustrating a part of the display device of FIG. 18.

A display device 10 of FIGS. 18 and 19 differs from the display device 10 of FIG. 7 in that it further includes a second rigid member 500.

Referring to FIGS. 18 and 19, the display device 10 may further include the second rigid member 500, which is disposed between a display panel 100 and an elastic member 300.

The second rigid member 500 may serve an impact mitigation function to protect the display panel 100. For example, the second rigid member 500 may mitigate the impact transmitted from the elastic member 300. Consequently, the display device 10 can have high resistance to external impacts.

The second rigid member 500 may include a material with a high rigidity and high flexibility. The second rigid member 500 may include at least one of PET and polyimide. In some embodiments, the second rigid member 500 may include the same material as a first rigid member 400, but the present disclosure is not limited thereto. Alternatively, the second rigid member 500 may include a different material from the first rigid member 400.

The thickness of the second rigid member 500 may be smaller than the thickness of the first rigid member 400. The second rigid member 500 may have a thickness of about 50 µm to about 90 µm. Preferably, the second rigid member 500 may have a thickness of about 75 µm. In some embodiments, the second rigid member 500 may have the same modulus value as the first rigid member 400.

The second rigid member 500 is illustrated as being a single layer, but the present disclosure is not limited thereto. Alternatively, the second rigid member 500 may have a multilayer structure consisting of two or more layers.

As the first and second rigid members 400 and 500 are disposed on the front and rear surfaces, respectively, of the display device 10, the impact applied to the display panel 100 can be further minimized.

The display device 10 may further include a fifth adhesive member ADH5.

The fifth adhesive member ADH5 may be disposed on the rear surface of the second rigid member 500. In an embodiment, for example, the fifth adhesive member ADH5 may be disposed between the second rigid member 500 and the display panel 100. The second rigid member 500 and the display panel 100 may be coupled to each other through the fifth adhesive member ADH5.

The fifth adhesive member ADH5 may include a transparent adhesive such as a PSA or an OCA. The fifth adhesive member ADH5 may include an acrylic adhesive material.

In some embodiments, the fifth adhesive member ADH5 may include a dilatant. As the fifth adhesive member ADH5 includes the dilatant, the impact applied to the display panel 100 can be minimized.

A thickness ADH5_H of the fifth adhesive member ADH5 may be greater than each of thicknesses ADH1_H and ADH2_H of first and second adhesive members ADH1 and ADH2. The thickness ADH5_H of the fifth adhesive member ADH5 may be the same as each of thicknesses ADH3_H and ADH4_H of third and fourth adhesive members ADH3 and ADH4. In an embodiment, for example, the thickness ADH5_H of the fifth adhesive member ADH5 may be about 75 µm.

In some embodiments, the third adhesive member ADH3, which is disposed between the elastic member 300 and the second rigid member 500, may include an adhesive material. In an embodiment, for example, the adhesive force of the third adhesive member ADH3 may be weaker than the adhesive force of each of the first, second, fourth, fifth, and eighth adhesive members ADH1, ADH2, ADH4, ADH5, and ADH8.

Furthermore, in some embodiments, a width ADH3_W of the third adhesive member ADH3, which is positioned between the elastic member 300 and the second rigid member 500, in the first direction DR1 may be smaller than each of widths ADH1_W, ADH2_W, ADH4_W, and ADH5_W of the first, second, fourth, and fifth adhesive members ADH1, ADH2, ADH4, and ADH5.

As the third adhesive member ADH3 has weaker adhesive force and a smaller width than each of the other adhesive members, the layers disposed on the third adhesive member ADH3 can be detached more easily than each of other layers in the display device 10. Consequently, if some of the layers on an upper member UM are damaged, they can be easily replaced with new layers.

Figure 20:
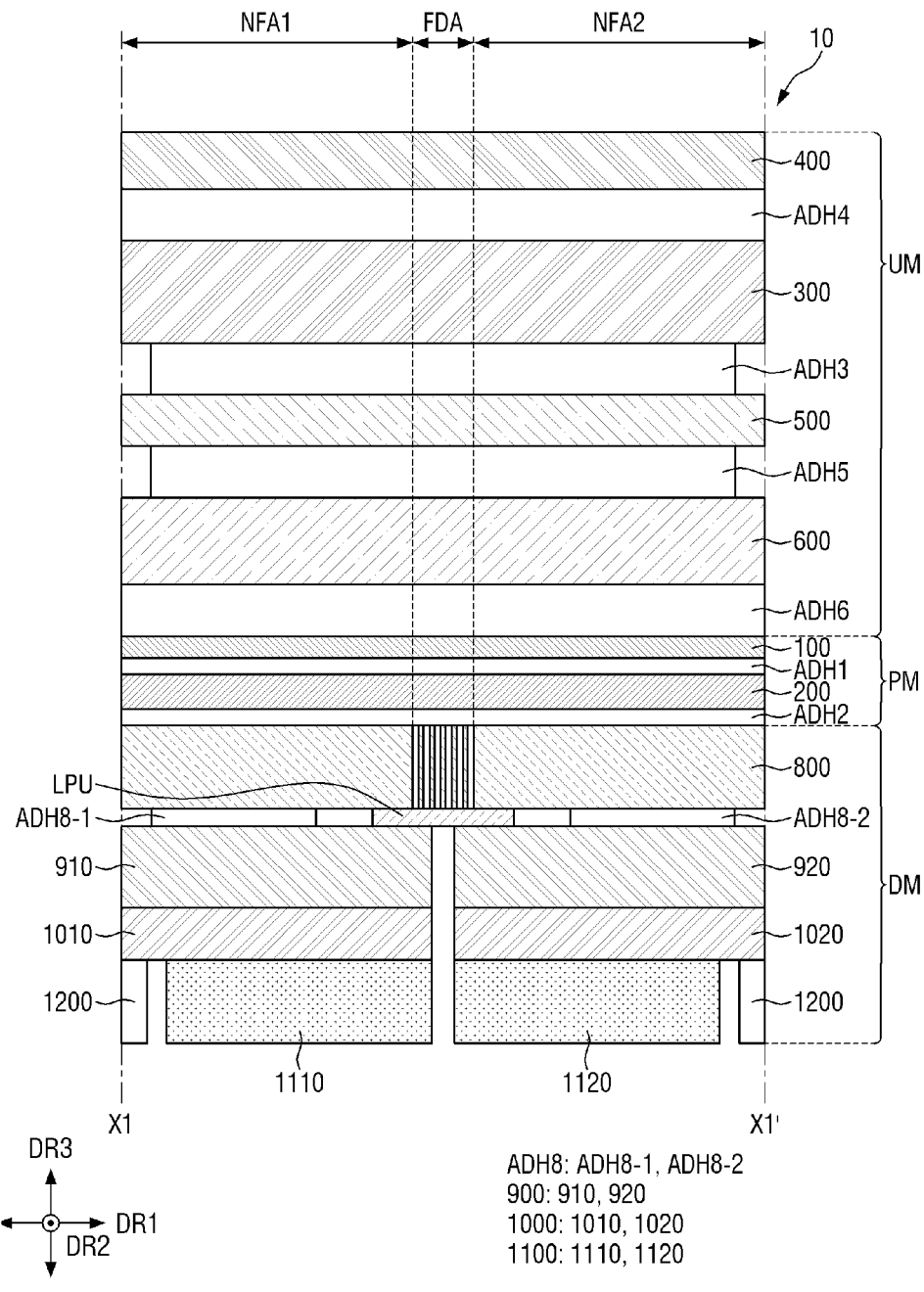
FIG. 20 is a cross-sectional view of a display device according to still another embodiment of the present disclosure.
Figure 21:
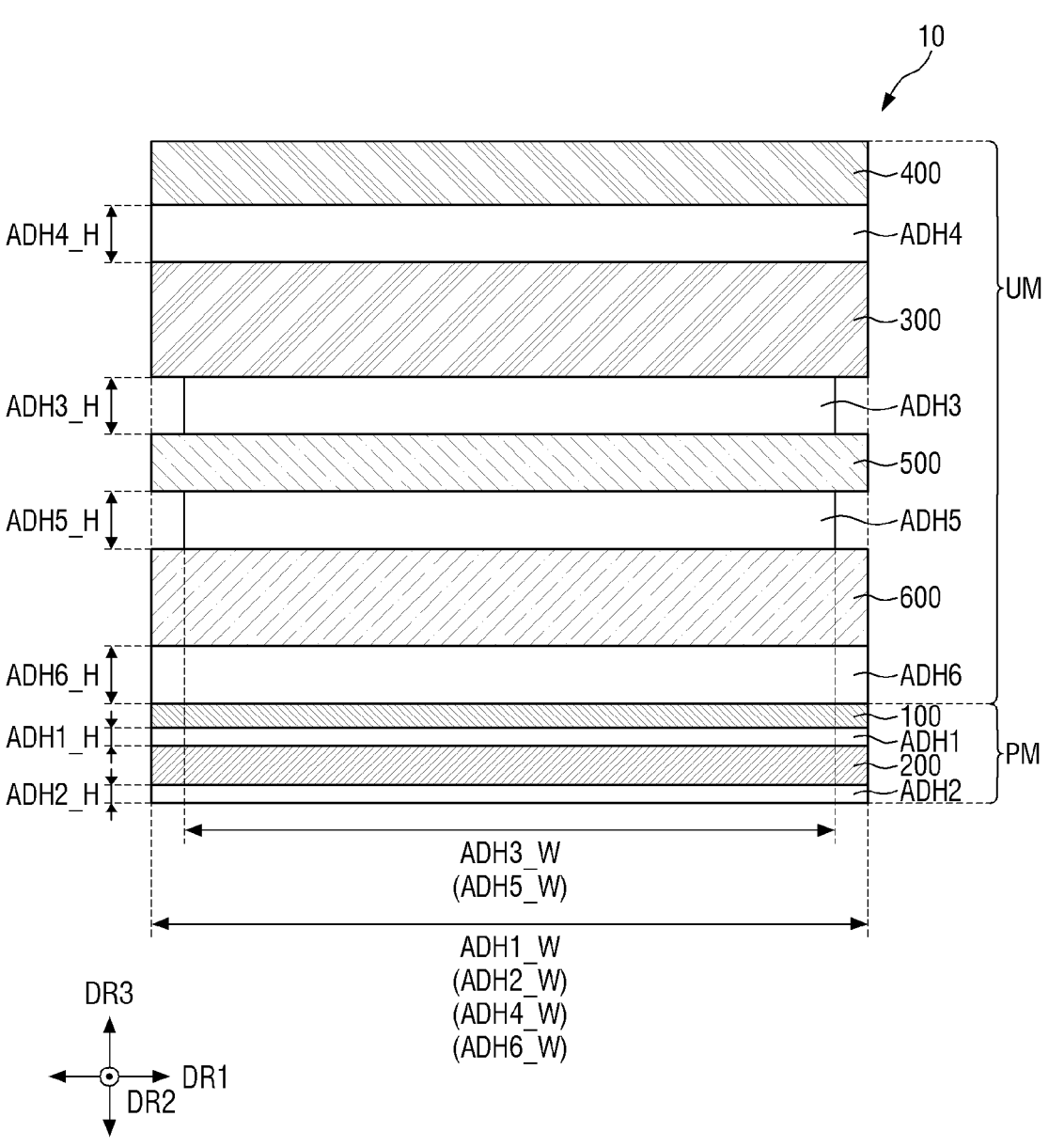
FIG. 21 is a cross-sectional view illustrating a part of the display device of FIG. 20.

FIG. 20 is a cross-sectional view of a display device according to still another embodiment of the present disclosure. FIG. 21 is a cross-sectional view illustrating a part of the display device of FIG. 20.

A display device 10 of FIGS. 20 and 21 differs from the display device 10 of FIG. 18 in that it further includes a third rigid member 600.

Referring to FIGS. 20 and 21, the display device 10 may further include the third rigid member 600, which is disposed between a display panel 100 and a second rigid member 500.

The third rigid member 600 may serve an impact mitigation function to protect the display panel 100. For example, the third rigid member 600 may mitigate the impact transmitted to the second rigid member 500. Consequently, the display device 10 can have high resistance to external impacts.

The third rigid member 600 may include a material with a high rigidity and high flexibility. The third rigid member 600 may include UTG. In some embodiments, the third rigid member 600 may include the same material as a first rigid member 400, but the present disclosure is not limited thereto. Alternatively, the third rigid member 600 may include a different material from the first rigid member 400.

In some embodiments, the thickness of the third rigid member 600 may be greater than each of thicknesses of the first and second rigid members 400 and 500. In an embodiment, for example, the third rigid member 600 may have a thickness of about 80 µm to about 100 µm. Preferably, the third rigid member 600 may have a thickness of about 90 µm. As the third rigid member 600 includes glass, the third rigid member 600 is thicker than each of the first and second rigid members 400 and 500. Consequently, the risk of breakage can be minimized. Furthermore, as the third rigid member 600, which includes UTG, is placed below the first and second rigid members 400 and 500, the risk of breakage can be further minimized.

The third rigid member 600 may have a greater modulus value than each of the first and second rigid members 400 and 500. In an embodiment, for example, the third rigid member 600 may have a modulus value of about 20 GPa. As the third rigid member 600 has a greater modulus value than each of the first and second rigid members 400 and 500, the impact resistance of the display device 10 can be further enhanced.

The display device 10 may further include a sixth adhesive member ADH6.

The sixth adhesive member ADH6 may be disposed on the rear surface of the third rigid member 600. In an embodiment, for example, the sixth adhesive member ADH6 may be disposed between the third rigid member 600 and the display panel 100. The third rigid member 600 and the display panel 100 may be coupled to each other through the sixth adhesive member ADH6.

The sixth adhesive member ADH6 may include a transparent adhesive such as a PSA or an OCA. The sixth adhesive member ADH6 may include an acrylic adhesive material.

In some embodiments, the sixth adhesive member ADH6 may include a dilatant. As the sixth adhesive member ADH6 includes the dilatant, the impact applied to the display panel 100 can be minimized.

A thickness ADH6_H of the sixth adhesive member ADH6 may be greater than each of thicknesses ADH1_H and ADH2_H of first and second adhesive members ADH1 and ADH2. The thickness ADH6_H of the sixth adhesive member ADH6 may be the same as each of thicknesses ADH3_H, ADH4_H, and ADH5_H of third, fourth, and fifth adhesive members ADH3, ADH4, and ADH5. In an embodiment, for example, the thickness ADH6_H of the sixth adhesive member ADH6 may be about 75 μm.

In some embodiments, the fifth adhesive member ADH5, which is disposed between the second and third rigid members 500 and 600, may include an adhesive material. In an embodiment, for example, the adhesive force of the fifth adhesive member ADH5 may be weaker than the adhesive force of each of the first, second, fourth, and sixth adhesive members ADH1, ADH2, ADH4, and ADH6 and an eighth adhesive member ADH8.

Furthermore, in some embodiments, a width ADH5_W of the fifth adhesive member ADH5, which is disposed between the second and third rigid members 500 and 600, may be smaller than each of widths ADH1_W, ADH2_W, ADH4_W, and ADH6_W of the first, second, fourth, and sixth adhesive members ADH1, ADH2, ADH4, and ADH6.

As the fifth adhesive member ADH5 has weaker adhesive force and a smaller width than each of the other adhesive members, the layers disposed on the fifth adhesive member ADH5 can be detached more easily than each of other layers in the display device 10. Consequently, if some of the layers on an upper member UM are damaged, they can be easily replaced with new layers.

Figure 22:
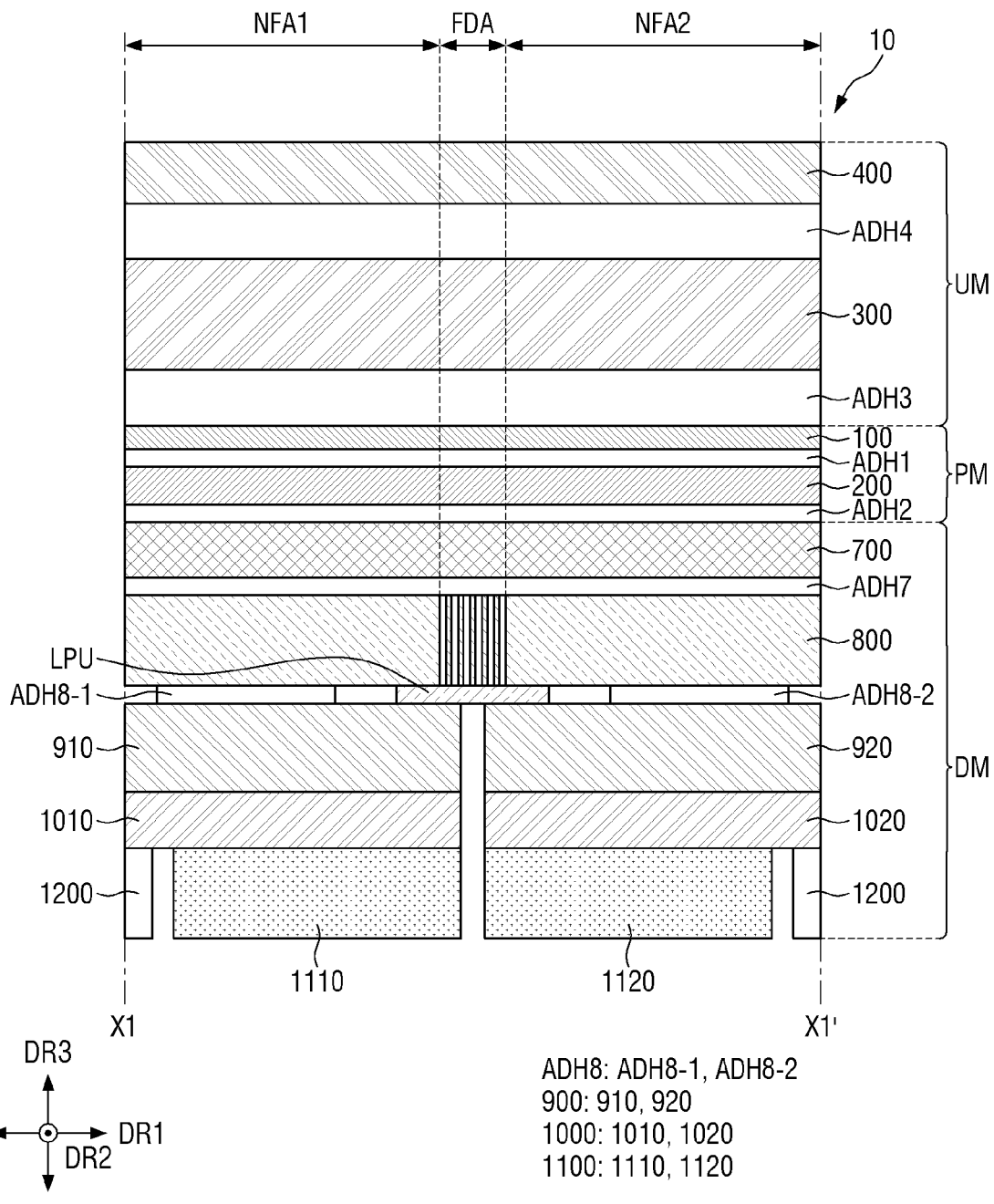
FIG. 22 is a cross-sectional view of a display device according to yet another embodiment of the present disclosure.
Figure 23:
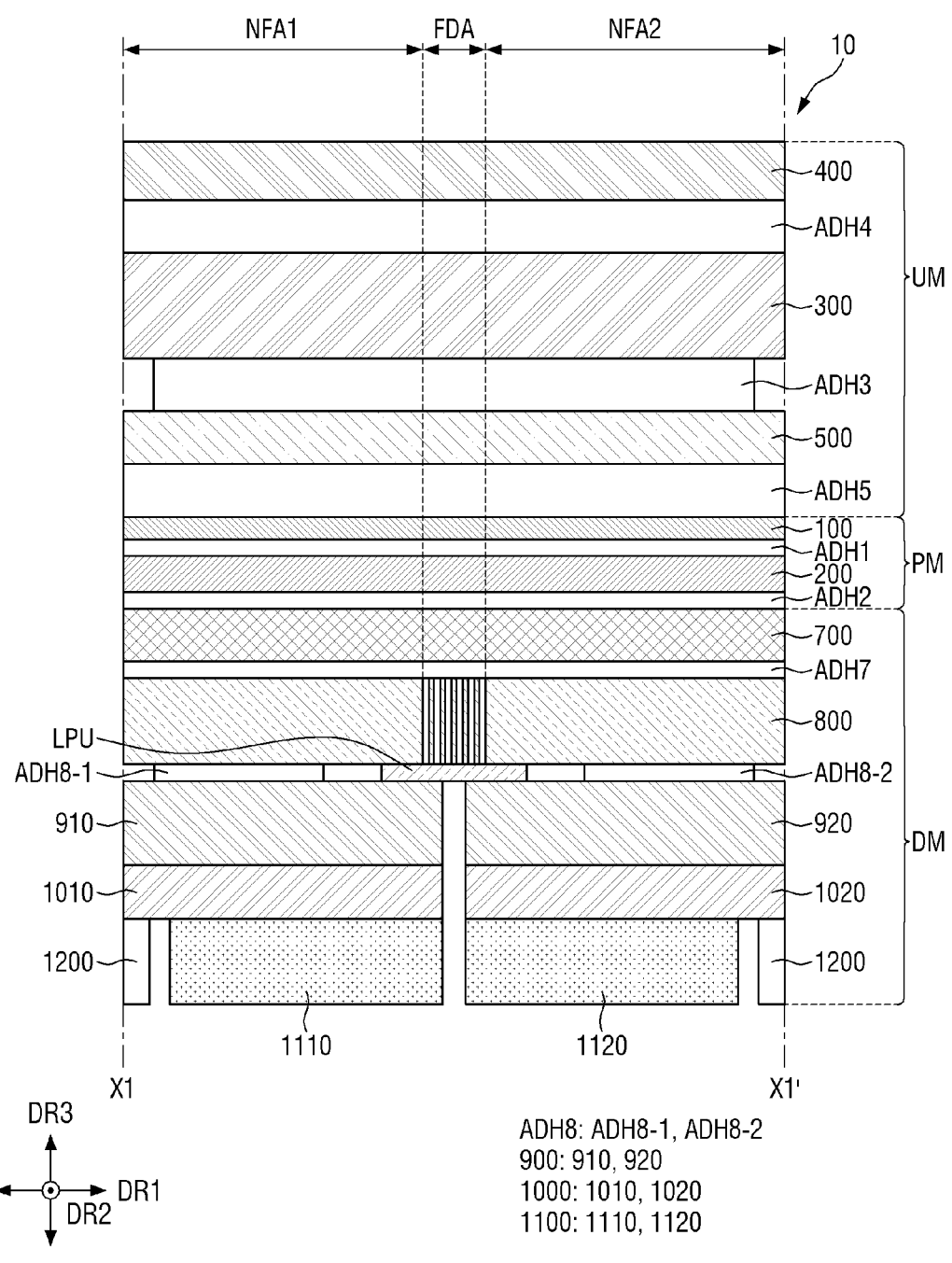
FIG. 23 is a cross-sectional view of a display device according to another embodiment of the present disclosure.
Figure 24:
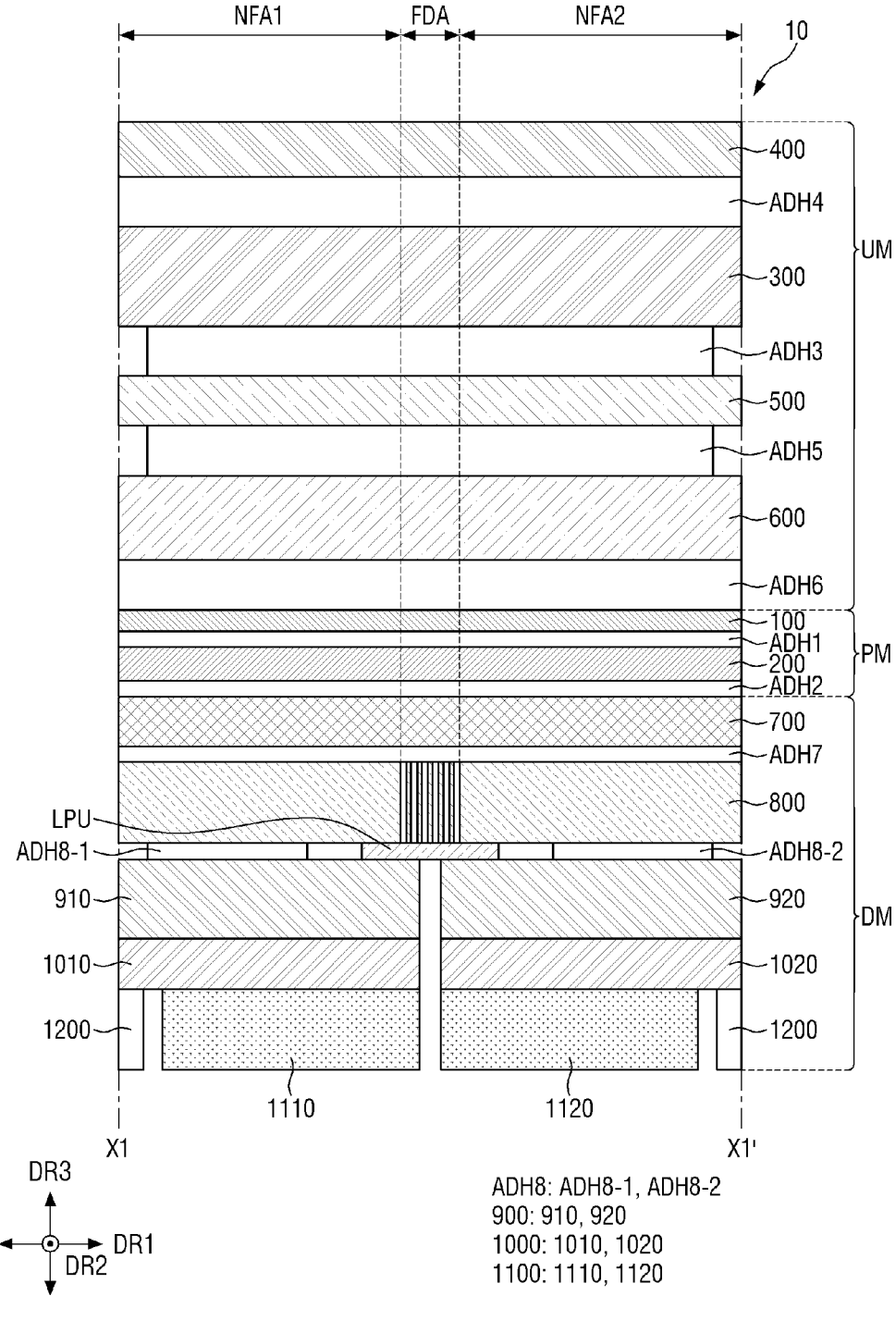
FIG. 24 is a cross-sectional view of a display device according to still another embodiment of the present disclosure.

FIG. 22 is a cross-sectional view of a display device according to yet another embodiment of the present disclosure. FIG. 23 is a cross-sectional view of a display device according to another embodiment of the present disclosure. FIG. 24 is a cross-sectional view of a display device according to still another embodiment of the present disclosure.

A display device 10 of any one of FIGS. 22 through 24 differs from the display devices 10 of FIGS. 7, 18, and 20 in that they further include a fourth rigid member 700.

Referring to FIGS. 22 through 24, the fourth rigid member 700 may be disposed between a panel member PM and a panel support member 800.

The fourth rigid member 700 may serve an impact mitigation function to protect a display panel 100. For example, the fourth rigid member 700 may mitigate the impact applied to the display panel 100 by countering the reaction of the panel support member 800. Consequently, the display device 10 can have high resistance to external impacts.

The fourth rigid member 700 may include a material with a high rigidity and high flexibility. The fourth rigid member 700 may include at least one of PET and polyimide. In some embodiments, the fourth rigid member 700 may include the same material as a second rigid member 500, but the present disclosure is not limited thereto. Alternatively, the fourth rigid member 700 may include a different material from the second rigid member 500.

The thickness of the fourth rigid member 700 may be smaller than the thickness of a first rigid member 400. The fourth rigid member 700 may have a thickness of about 50 μm to about 90 μm. Preferably, the fourth rigid member 700 may have a thickness of about 75 μm. In some embodiments, the fourth rigid member 700 may have the same thickness as the second rigid member 500. In some embodiments, the fourth rigid member 700 may have the same modulus value as the second rigid member 500.

The fourth rigid member 700 is illustrated as being a single layer, but the present disclosure is not limited thereto. Alternatively, the fourth rigid member 700 may have a multilayer structure consisting of two or more layers.

As at least one of the first rigid member 400, the second rigid member 500, and a third rigid member 600 is disposed on the front surface of the display panel 100 and the fourth rigid member 700 is disposed on the rear surface of the display panel 100, the impact applied to the display panel 100 can be further minimized.

The display device 10 may further include a seventh adhesive member ADH7.

The seventh adhesive member ADH7 may be disposed on the rear surface of the fourth rigid member 700. In an embodiment, for example, the seventh adhesive member ADH7 may be disposed between the fourth rigid member 700 and the panel support member 800. The fourth rigid member 700 and the panel support member 800 may be coupled to each other through the seventh adhesive member ADH7.

The seventh adhesive member ADH7 may include a transparent adhesive such as a PSA or an OCA. The seventh adhesive member ADH7 may include an acrylic adhesive material.

A thickness ADH7_H of the seventh adhesive member ADH7 may be greater than each of thicknesses ADH3_H, ADH4_H, ADH5_H, and ADH6_H of third, fourth, fifth, and sixth adhesive members ADH3, ADH4, ADH5, and ADH6. The thickness ADH7_H of the seventh adhesive member ADH7 may be the same as each of thicknesses ADH1_H and ADH2_H of first and second adhesive members ADH1 and ADH2. In an embodiment, for example, the thickness ADH7_H of the seventh adhesive member ADH7 may be about 25 μm.

In concluding the detailed description, those skilled in the art will appreciate that many variations and modifications can be made to the preferred embodiments without substantially departing from the principles of the present disclosure. Therefore, the disclosed preferred embodiments of the invention are used in a generic and descriptive sense only and not for purposes of limitation.

What is claimed is:

1. A display device comprising:
a display panel including first and second surfaces, which are opposite to each other;
an elastic member disposed on the first surface;
a first rigid member disposed on the elastic member;
a second rigid member disposed between the elastic member and the display panel;
a third rigid member disposed between the second rigid member and the display panel; and
a panel support member disposed on the second surface, wherein
the first rigid member includes at least one of polyethylene terephthalate (PET), polyimide, and ultra-thin glass (UTG),
the elastic member includes at least one of a dilatant, polyether block amide (PEBA), and thermoplastic polyurethane (TPU),
the third rigid member has a greater thickness than the first rigid member, and
the first rigid member has a greater thickness than the second rigid member.

2. The display device of claim 1,
wherein the second rigid member includes at least one of PET and polyimide.

3. The display device of claim 1,
wherein the third rigid member includes UTG.

4. The display device of claim 3, wherein the third rigid member has a greater modulus value than each of the first and second rigid members.

5. The display device of claim 1, wherein the third rigid member and the display panel are coupled to each other by an adhesive member therebetween.

6. The display device of claim 1, further comprising:
a fourth rigid member disposed between the display panel and the panel support member,
wherein the fourth rigid member includes at least one of PET and polyimide.

7. The display device of claim 1, further comprising:
at least one of first and second adhesive members, the first adhesive member being disposed between the display panel and the elastic member and the second adhesive member being disposed between the elastic member and the first rigid member,
wherein the at least one of the first and second adhesive members includes a dilatant.

8. A display device comprising:
a display panel including first and second surfaces, which are opposite to each other;
an elastic member disposed on the first surface;
a first rigid member disposed on the elastic member;
a panel support member disposed on the second surface;
a second rigid member disposed between the elastic member and the display panel;
at least one upper adhesive member disposed between two of the display panel, the elastic member, the first rigid member, and the second rigid member; and
at least one lower adhesive member disposed between the display panel and the panel support member,
wherein the at least one upper adhesive member has a greater thickness than the at least one lower adhesive member,
wherein the at least one upper adhesive member includes:
a first adhesive member, which is disposed between the display panel and the second rigid member; and
a second adhesive member, which is disposed between the second rigid member and the elastic member, and
wherein the second adhesive member has a smaller width than the first adhesive member.

9. The display device of claim 8, wherein the thickness of the at least one upper adhesive member is two to five times the thickness of the at least one lower adhesive member.

10. The display device of claim 8, wherein the second adhesive member has a weaker adhesive force than the first adhesive member.

11. The display device of claim 8, further comprising:
a third rigid member disposed between the second rigid member and the display panel, wherein
the at least one upper adhesive member includes:
a first adhesive member, which is disposed between the display panel and the third rigid member; and
a second adhesive member, which is disposed between the second rigid member and the third rigid member, and
wherein the second adhesive member has a smaller width than the first adhesive member.

12. The display device of claim 11, wherein the third rigid member includes ultra-thin glass (UTG).

13. The display device of claim 11, further comprising:
a fourth rigid member disposed between the display panel and the panel support member,
wherein the fourth rigid member includes at least one of polyethylene terephthalate (PET) and polyimide.

14. A display device comprising:
a display panel including first and second surfaces, which are opposite to each other;
an elastic member disposed on the first surface;
a first rigid member disposed on the elastic member;
a second rigid member disposed between the elastic member and the display panel;
a third rigid member disposed between the second rigid member and the display panel; and
a panel support member disposed on the second surface,
wherein the first rigid member has a greater modulus value than the elastic member,
wherein the third rigid member has a greater modulus value than each of the first and second rigid members.

15. The display device of claim 14, wherein the elastic member has a modulus value of less than 1 gigapascal (GPa) at room temperature.

16. The display device of claim 14, wherein the first rigid member has a modulus value of 10 GPa to 15 GPa at room temperature.

17. The display device of claim 14, wherein the first rigid member includes at least one of polyethylene terephthalate (PET), polyimide, and ultra-thin glass (UTG).

18. The display device of claim 14, wherein the elastic member includes a dilatant.

19. The display device of claim 14, wherein the elastic member includes at least one of polyether block amide (PEBA) and thermoplastic polyurethane (TPU).

20. The display device of claim 14,
wherein the second rigid member includes at least one of PET and polyimide.

21. The display device of claim 14,
wherein the third rigid member includes UTG.

22. The display device of claim 14, further comprising:
a fourth rigid member disposed between the display panel and the panel support member,
wherein the fourth rigid member includes at least one of PET and polyimide.

23. The display device of claim 14, wherein the first surface is a display surface for displaying images.

* * * * *